United States Patent
Zhang et al.

(10) Patent No.: US 9,576,975 B2
(45) Date of Patent: Feb. 21, 2017

(54) MONOLITHIC THREE-DIMENSIONAL NAND STRINGS AND METHODS OF FABRICATION THEREOF

(71) Applicant: SANDISK TECHNOLOGIES, INC., Plano, TX (US)

(72) Inventors: Yanli Zhang, San Jose, CA (US); James Kai, Santa Clara, CA (US); Raghuveer S. Makala, Campbell, CA (US); Jin Liu, Milpitas, CA (US); Murshed Chowdhury, Milpitas, CA (US); Camilla Huang, Milpitas, CA (US); Johann Alsmeier, San Jose, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/957,762

(22) Filed: Dec. 3, 2015

(65) Prior Publication Data

US 2016/0086972 A1    Mar. 24, 2016

Related U.S. Application Data

(63) Continuation-in-part of application No. 14/468,650, filed on Aug. 26, 2014.

(51) Int. Cl.
*H01L 27/115* (2006.01)
*H01L 21/768* (2006.01)

(52) U.S. Cl.
CPC ..... *H01L 27/11582* (2013.01); *H01L 21/7682* (2013.01); *H01L 27/1157* (2013.01);
(Continued)

(58) Field of Classification Search
None
See application file for complete search history.

(56) References Cited

U.S. PATENT DOCUMENTS

| 5,084,417 A | 1/1992 | Joshi et al. |
| 5,563,105 A | 10/1996 | Dobusinsky et al. |

(Continued)

FOREIGN PATENT DOCUMENTS

WO    WO02/15277 A2    2/2002

OTHER PUBLICATIONS

International Search Report and Written Opinion for PCT/US2015/046035, dated Mar. 17, 2016, 20 pages.

(Continued)

*Primary Examiner* — Erik Kielin
(74) *Attorney, Agent, or Firm* — The Marbury Law Group PLLC

(57) ABSTRACT

A vertically repeating stack of a unit layer stack is formed over a substrate. The unit layer stack includes a sacrificial material layer, a lower silicon oxide material layer, a first silicon oxide material layer, and an upper silicon oxide material layer. A memory opening can be formed through the vertically repeating stack, and a layer stack including a blocking dielectric layer, a memory material layer, a tunneling dielectric, and a semiconductor channel can be formed in the memory opening. The sacrificial material layers are replaced with electrically conductive layers. The first silicon oxide material layer can be removed to form backside recesses. Optionally, portions of the memory material layer can be removed to from discrete charge storage regions. The backside recesses can be filled with a low-k dielectric material and/or can include cavities within a dielectric material to provide reduced coupling between electrically conductive layers.

10 Claims, 21 Drawing Sheets

(52) U.S. Cl.
CPC .. *H01L 27/11519* (2013.01); *H01L 27/11524* (2013.01); *H01L 27/11556* (2013.01); *H01L 27/11565* (2013.01)

(56) References Cited

U.S. PATENT DOCUMENTS

| | | |
|---|---|---|
| 5,807,788 A | 9/1998 | Brodsky et al. |
| 5,915,167 A | 6/1999 | Leedy |
| 7,177,191 B2 | 2/2007 | Fasoli et al. |
| 7,221,588 B2 | 5/2007 | Fasoli et al. |
| 7,233,522 B2 | 6/2007 | Chen et al. |
| 7,514,321 B2 | 4/2009 | Mokhlesi et al. |
| 7,575,973 B2 | 8/2009 | Mokhlesi et al. |
| 7,691,442 B2 | 4/2010 | Gandikota et al. |
| 7,745,265 B2 | 6/2010 | Mokhlesi et al. |
| 7,745,312 B2 | 6/2010 | Herner et al. |
| 7,808,038 B2 | 10/2010 | Mokhlesi et al. |
| 7,848,145 B2 | 12/2010 | Mokhlesi et al. |
| 7,851,851 B2 | 12/2010 | Mokhlesi et al. |
| 8,008,710 B2 | 8/2011 | Fukuzumi et al. |
| 8,053,829 B2 | 11/2011 | Kang et al. |
| 8,187,936 B2 | 5/2012 | Alsmeier et al. |
| 8,193,054 B2 | 6/2012 | Alsmeier |
| 8,198,672 B2 | 6/2012 | Alsmeier |
| 8,283,228 B2 | 10/2012 | Alsmeier |
| 8,349,681 B2 | 1/2013 | Alsmeier et al. |
| 8,658,499 B2 | 2/2014 | Makala et al. |
| 2007/0210338 A1 | 9/2007 | Orlowski |
| 2007/0252201 A1 | 11/2007 | Kito et al. |
| 2010/0044778 A1 | 2/2010 | Seol |
| 2010/0112769 A1 | 5/2010 | Son et al. |
| 2010/0120214 A1 | 5/2010 | Park et al. |
| 2010/0155810 A1 | 6/2010 | Kim et al. |
| 2010/0155818 A1 | 6/2010 | Cho |
| 2010/0181610 A1 | 7/2010 | Kim et al. |
| 2010/0207195 A1 | 8/2010 | Fukuzumi et al. |
| 2010/0320528 A1 | 12/2010 | Jeong et al. |
| 2011/0076819 A1 | 3/2011 | Kim et al. |
| 2011/0133606 A1 | 6/2011 | Yoshida et al. |
| 2011/0266606 A1 | 11/2011 | Park et al. |
| 2011/0298013 A1 | 12/2011 | Hwang et al. |
| 2012/0001247 A1 | 1/2012 | Alsmeier |
| 2012/0001249 A1 | 1/2012 | Alsmeier |
| 2012/0256247 A1 | 10/2012 | Alsmeier |
| 2013/0248974 A1 | 9/2013 | Alsmeier et al. |
| 2013/0264631 A1 | 10/2013 | Alsmeier et al. |
| 2013/0313627 A1 | 11/2013 | Lee et al. |
| 2014/0008714 A1 | 1/2014 | Makala et al. |
| 2014/0080309 A1 | 3/2014 | Park et al. |
| 2014/0191312 A1 | 7/2014 | Kim et al. |
| 2014/0220750 A1 | 8/2014 | Sohn et al. |
| 2014/0225181 A1 | 8/2014 | Makala et al. |
| 2014/0332873 A1 | 11/2014 | Yoo |
| 2015/0294980 A1 | 10/2015 | Lee et al. |
| 2015/0340274 A1 | 11/2015 | Ryan et al. |
| 2015/0364485 A1 | 12/2015 | Shimura et al. |

OTHER PUBLICATIONS

Invitation to Pay Additional Fees and Partial International Search Report for PCT/US2015/046035, dated Jan. 22, 2016, 9 pages.
Kang, D. et al., "Improving the Cell Characteristics Using Low-k Gate Spacer in 1Gb NAND Flash Memory," Electron Devices Meeting, IEDM '06 International, IEEE, pp. 1-4, (2006).
Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.
Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.
Maeda et al., "Multi-Stacked 1G Cell/Layer Pipe-Shaped BiCS Flash Memory," 2009 Symposium on VLSI Technology Digest of Technical Papers, pp. 22-23.
Endoh et al., "Novel Ultra High Density Memory with a Stacked-Surrounding Gate Transistor (S-SGT) Structured Cell," IEDM Proc. (2001) 33-36.
Tanaka et al., "Bit-Cost Scalable Technology for Low-Cost and Ultrahigh-Density Flash Memory," Toshiba Review, vol. 63, No. 2, 2008, pp. 28-31.
Kimura, "3D Cells Make Terabit NAND Flash Possible," Nikkei Electronics Asia, Sep. 17, 2009, 6pgs.
International Search Report & Written Opinion, PCT/US2011/042566, Jan. 17, 2012.
Invitation to Pay Additional Fees & Partial International Search Report, PCT/US2011/042566, Sep. 28, 2011.
Jang et al., "Memory Properties of Nickel Silicide Nanocrystal Layer for Possible Application to Nonvolatile Memory Devices," IEEE Transactions on Electron Devices, vol. 56, No. 12, Dec. 2009.
Chen et al., "Reliability Characteristics of NiSi Nanocrystals Embedded in Oxide and Nitride Layers for Nonvolatile Memory Application," Applied Physics Letters 92, 152114 (2008).
J. Ooshita, Toshiba Announces 32Gb 3D-Stacked Multi-Level NAND Flash, 3 pages, http://techon.nikkeibp.co.jp/english/NEWS_EN/20090619/171977/ Nikkei Microdevices, Tech-On, Jun. 19, 2009.
Wang et al., "Low Temperature Silicon Selective Epitaxial Growth (SEG) and Phosphorous Doping in a Reduced-Pressure Pancake Reactor", ECE Technical Reports, Paper 299 (Apr. 1, 1992).
Whang et al., "Novel 3-Dimensional Dual Control-Gate with Surrounding Floating-Gate (DC-SF) NAND Flash Cell for 1Tb File Storage Application", IEDM-2010 Proceedings, Dec. 6-8, 2010, pp. 668-671.
Kim, Y.S. et al., "Direct Copper Electroless Deposition on a Tungsten Barrier Layer for Ultralarge Scale Integration," J. Electrochem. Soc., vol. 152, Issue 2, pp. C89-C95, (2005).
Au, Y. et al., "Filling Narrow Trenches by Iodine-Catalyzed CVD of Copper and Manganese on Managanese Nitride Barrier/Adhesion Layers," J. Electrochem. Soc., vol. 158, Issue 5, pp. D248-D253, (2011).
Williams, K.R. et al., "Etch Rates for Micromachining Processing," J. Microelectromechanical Systems, vol. 5, No. 4, pp. 256-269, (1996).
Williams, K.R. et al., "Etch Rates for Micromachining Processing," Part II, J. Microelectromechanical Systems, vol. 12, No. 6, pp. 761-778, (2003).
Claes, M. et al., "Selective Wet Etching of Hf-Based Layers," Abs. 549, 204th Meeting, The Electrochemical Society, Inc., 1 page, (2003).
Non Final Office Action for Corresponding U.S. Appl. No. 14/468,650, filed Aug. 26, 2014, 19 pages, dated Feb. 5, 2016.
U.S. Appl. No. 13/762,988, filed Feb. 8, 2013, SanDisk Technologies Inc.
U.S. Appl. No. 14/133,979, filed Dec. 19, 2013, SanDisk Technologies Inc.
U.S. Appl. No. 14/183,152, filed Feb. 18, 2014, SanDisk Technologies Inc.
U.S. Appl. No. 14/219,161, filed Mar. 19, 2014, SanDisk Technologies Inc.
U.S. Appl. No. 14/225,116, filed Mar. 25, 2014, SanDisk Technologies Inc.
U.S. Appl. No. 14/225,176, filed Mar. 25, 2014, SanDisk Technologies Inc.
U.S. Appl. No. 14/264,262, filed Apr. 29, 2014, SanDisk Technologies Inc.
U.S. Appl. No. 14/264,312, filed Apr. 29, 2014, SanDisk Technologies Inc.
U.S. Appl. No. 14/264,407, filed Apr. 29, 2014, SanDisk Technologies Inc.
U.S. Appl. No. 14/282,567, filed May 20, 2014, SanDisk Technologies Inc.
U.S. Appl. No. 14/319,283, filed Jun. 30, 2004, SanDisk Technologies Inc.
U.S. Appl. No. 14/468,650, filed Aug. 26, 2014, SanDisk Technologies Inc.

(56) References Cited

OTHER PUBLICATIONS

U.S. Final Office Action for U.S. Appl. No. 14/468,650, dated May 27, 2016, 28 pages.
U.S. Final Office Action for U.S. Appl. No. 14/468,650, dated Sep. 19, 2016, 33 pages.

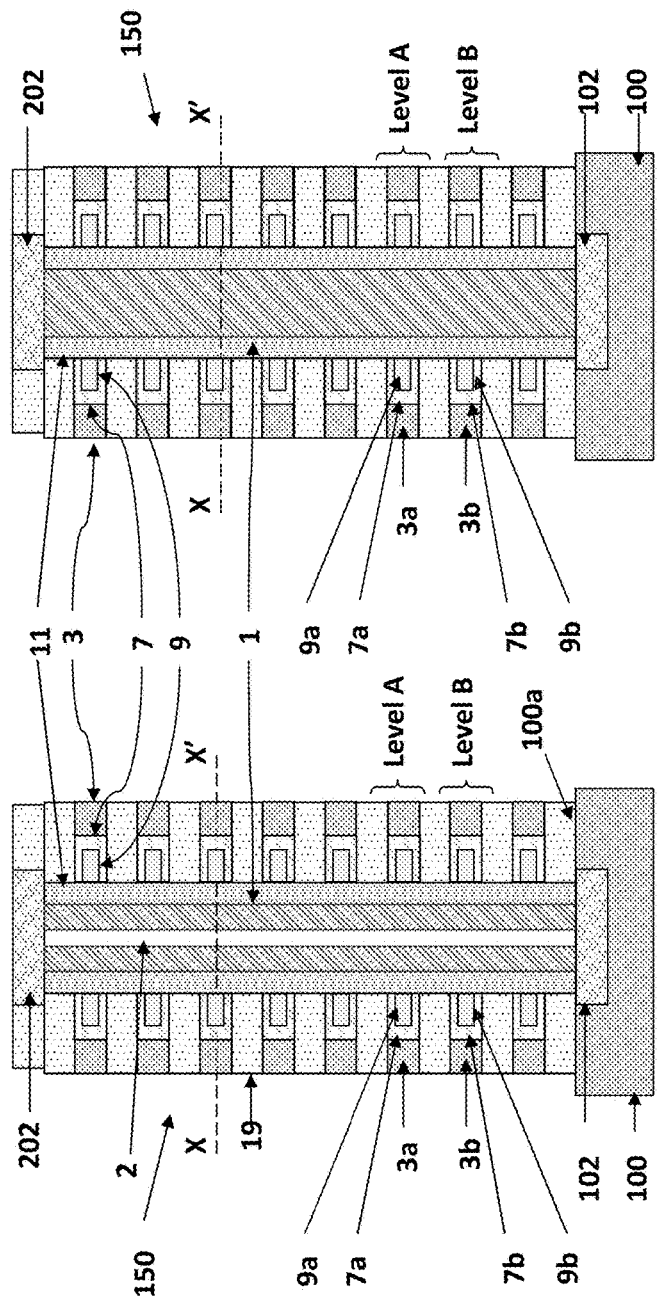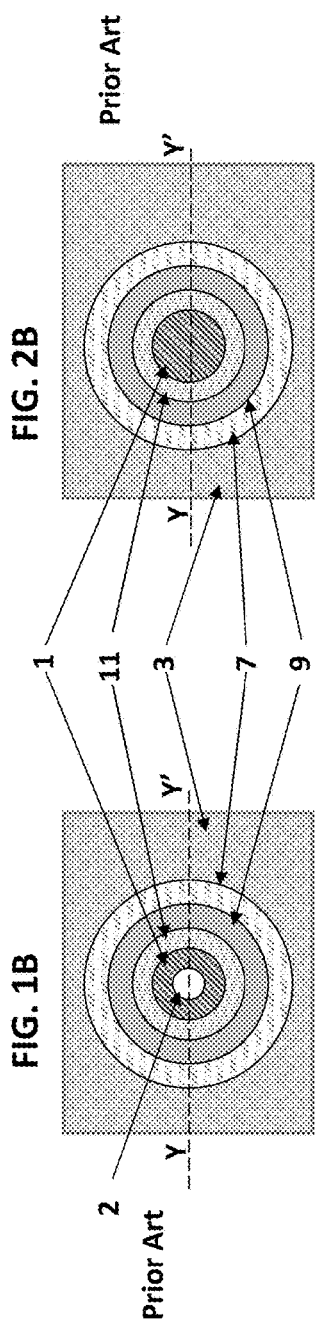

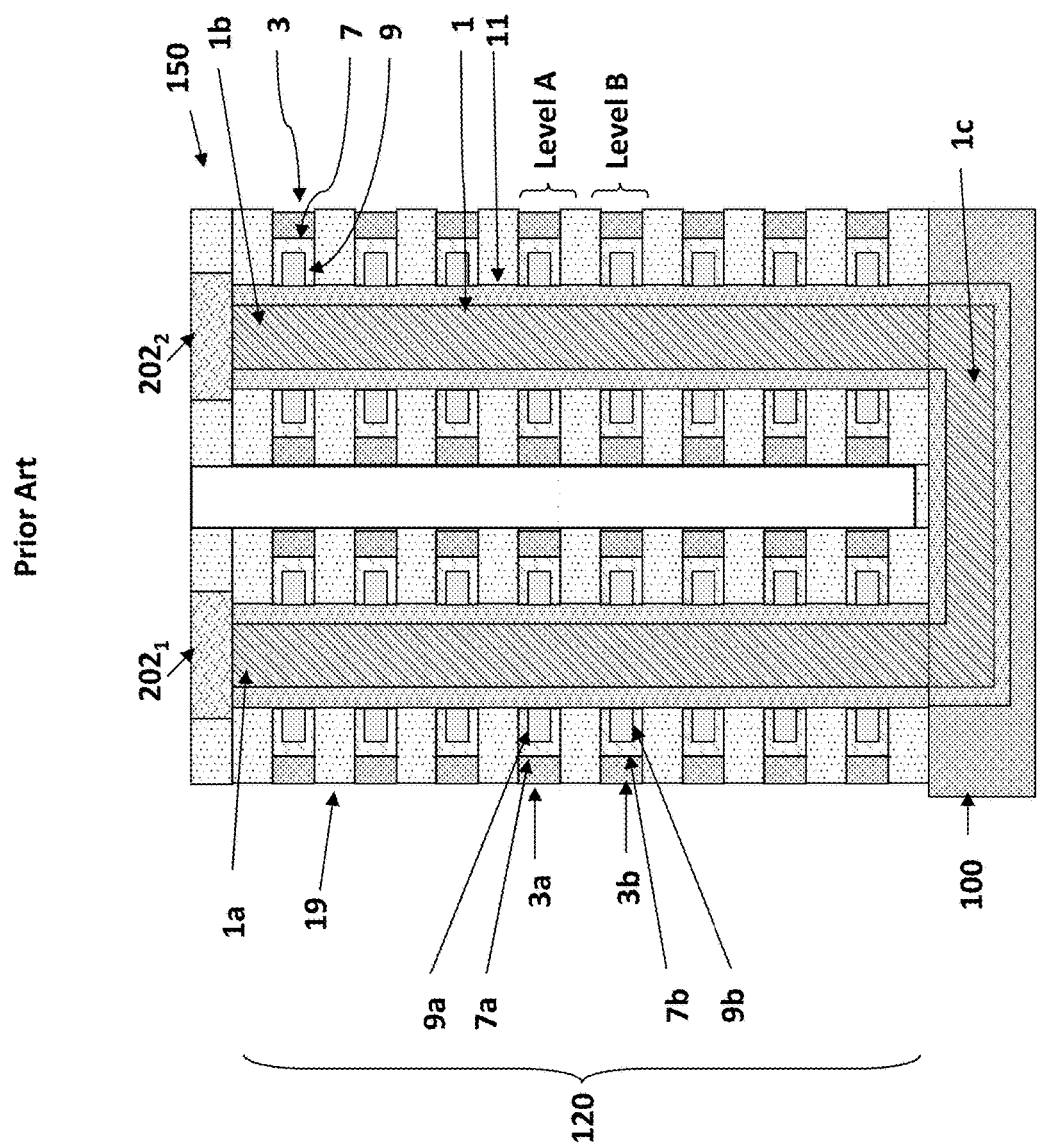

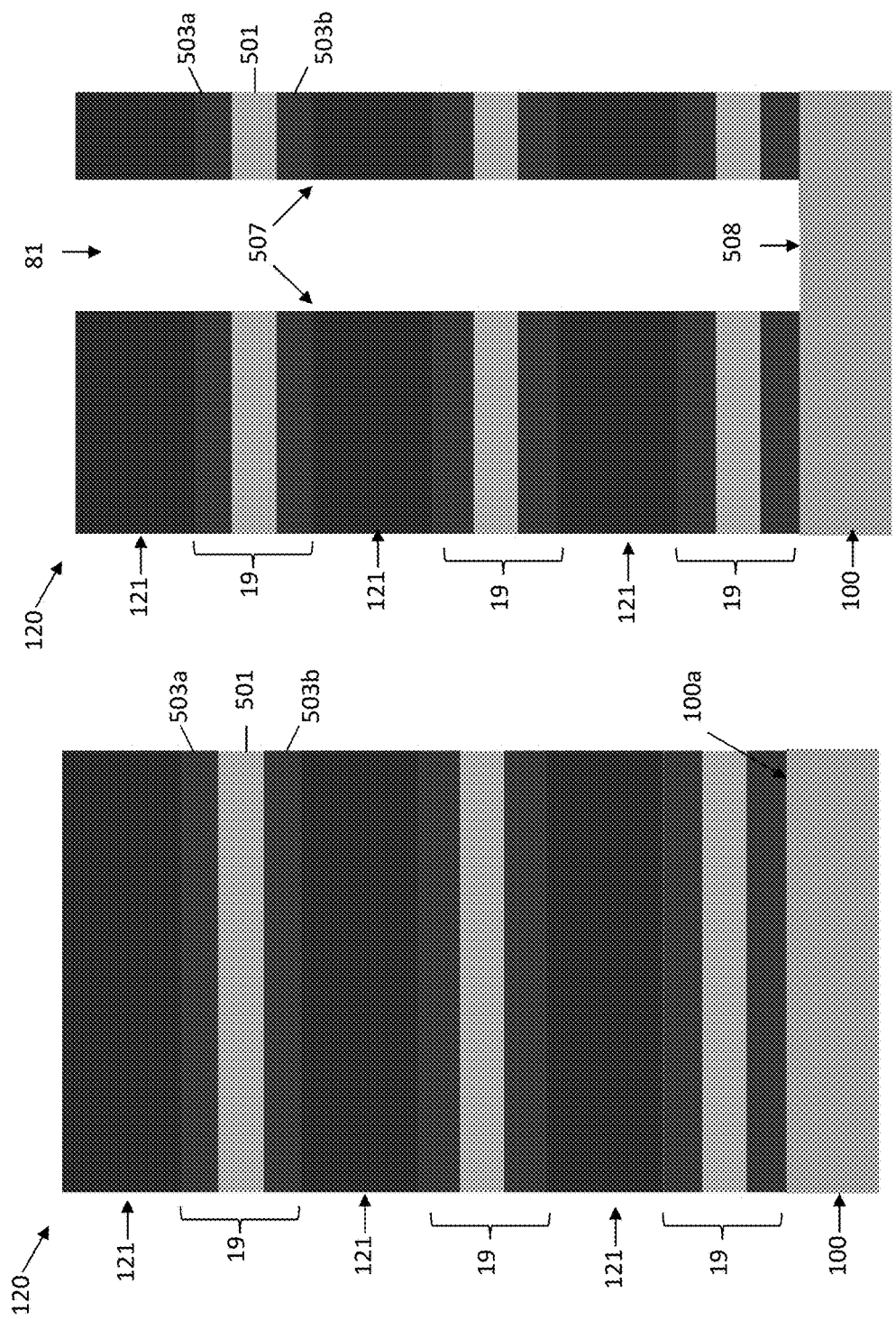

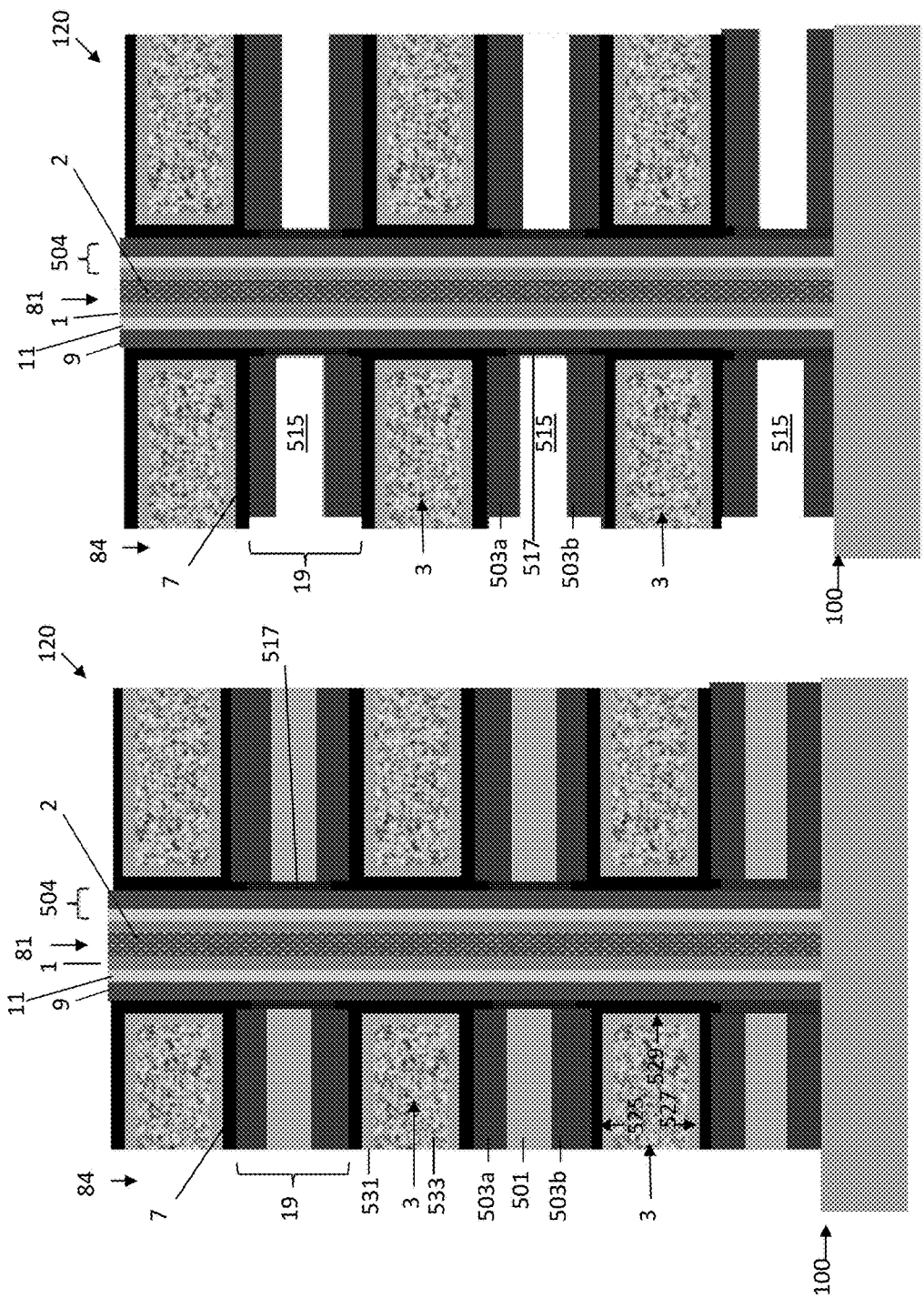

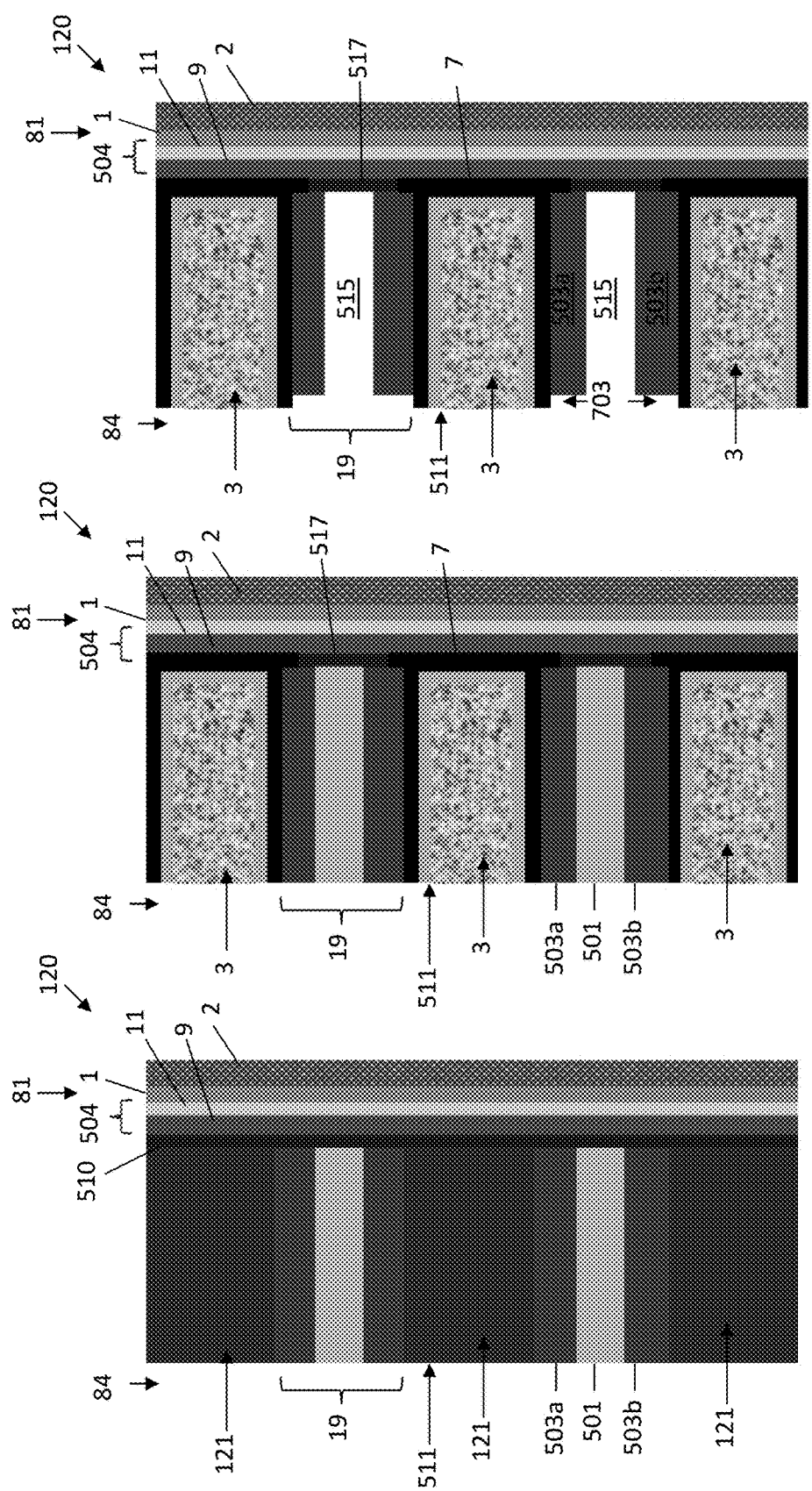

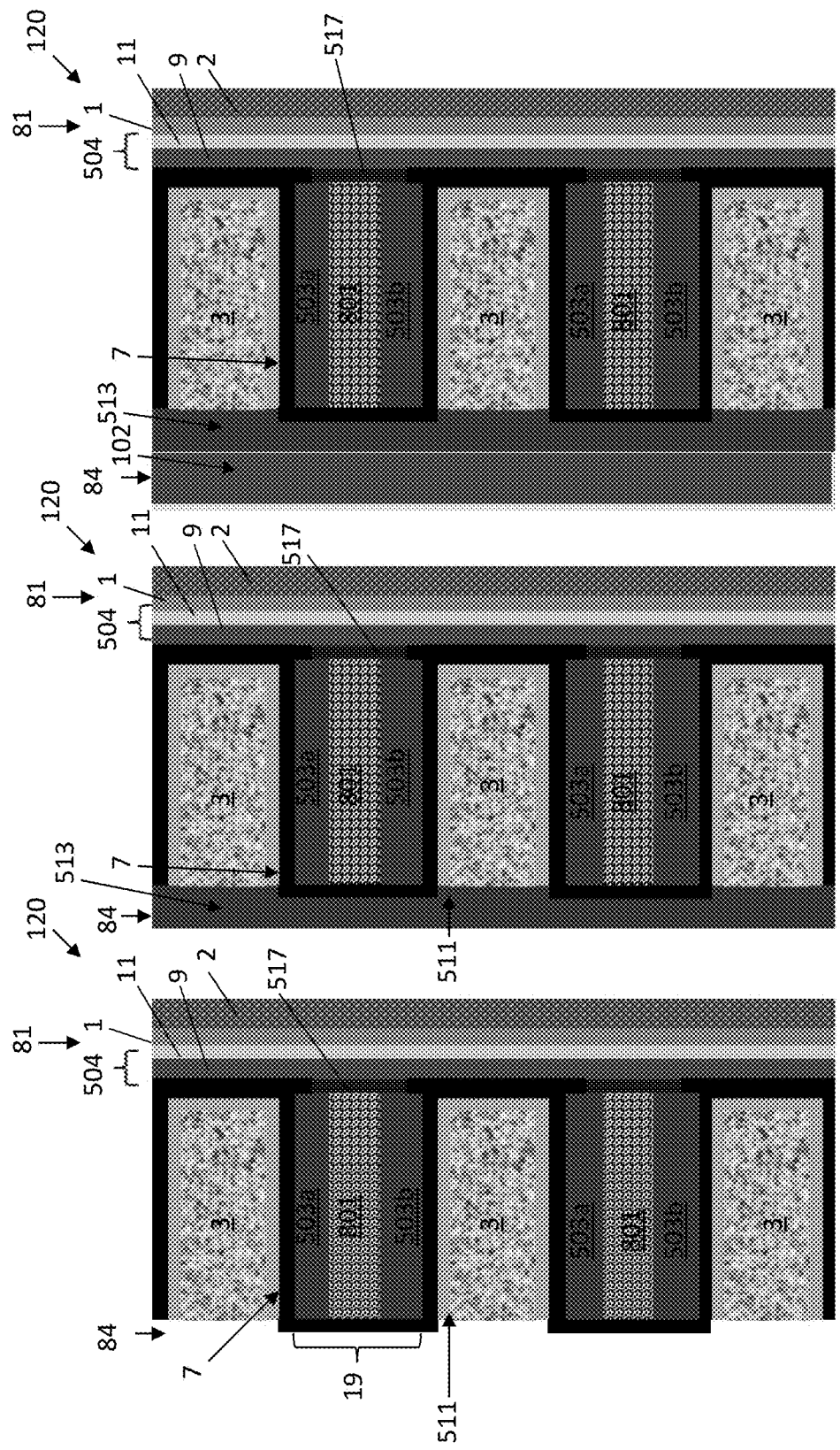

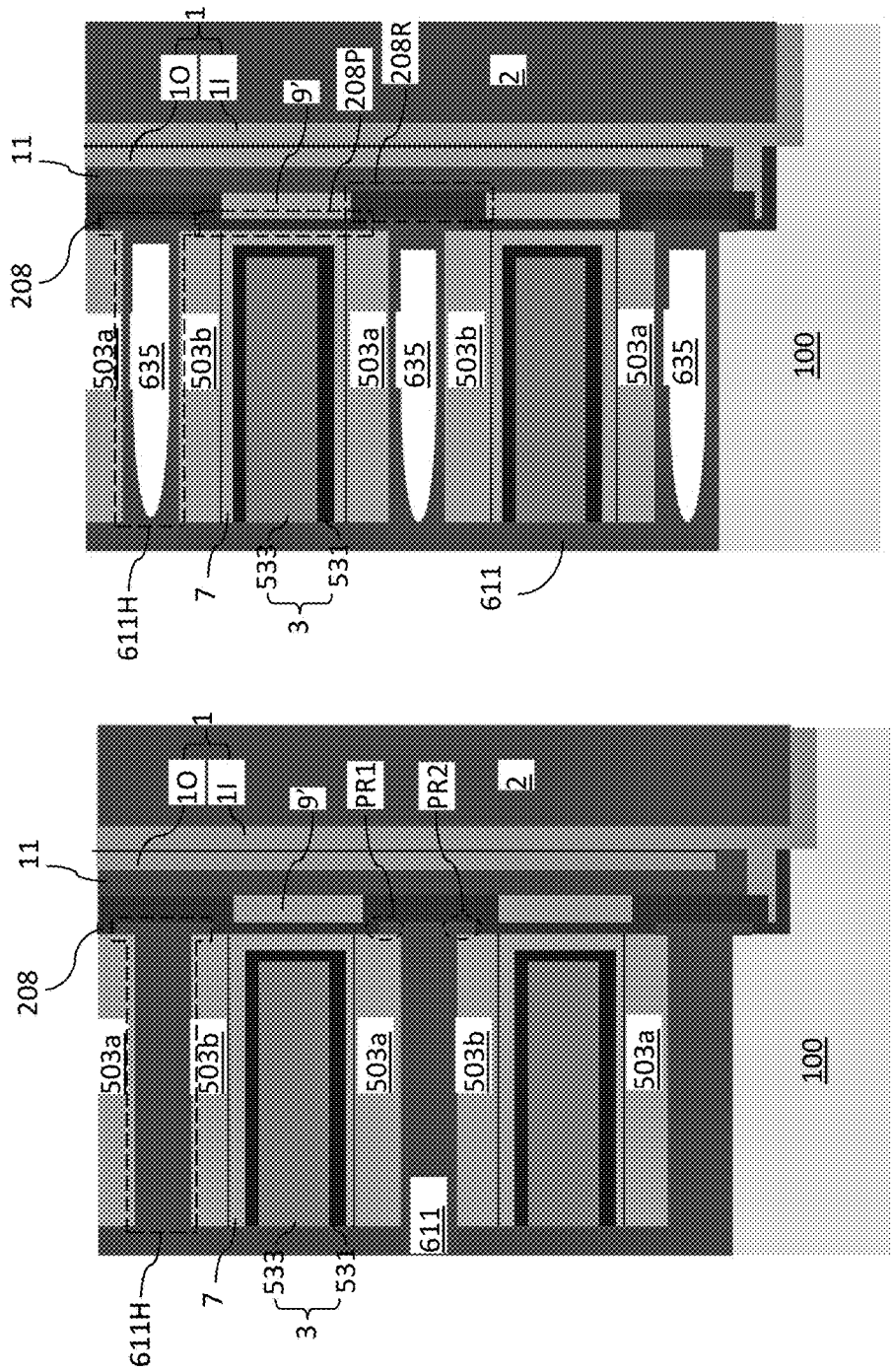

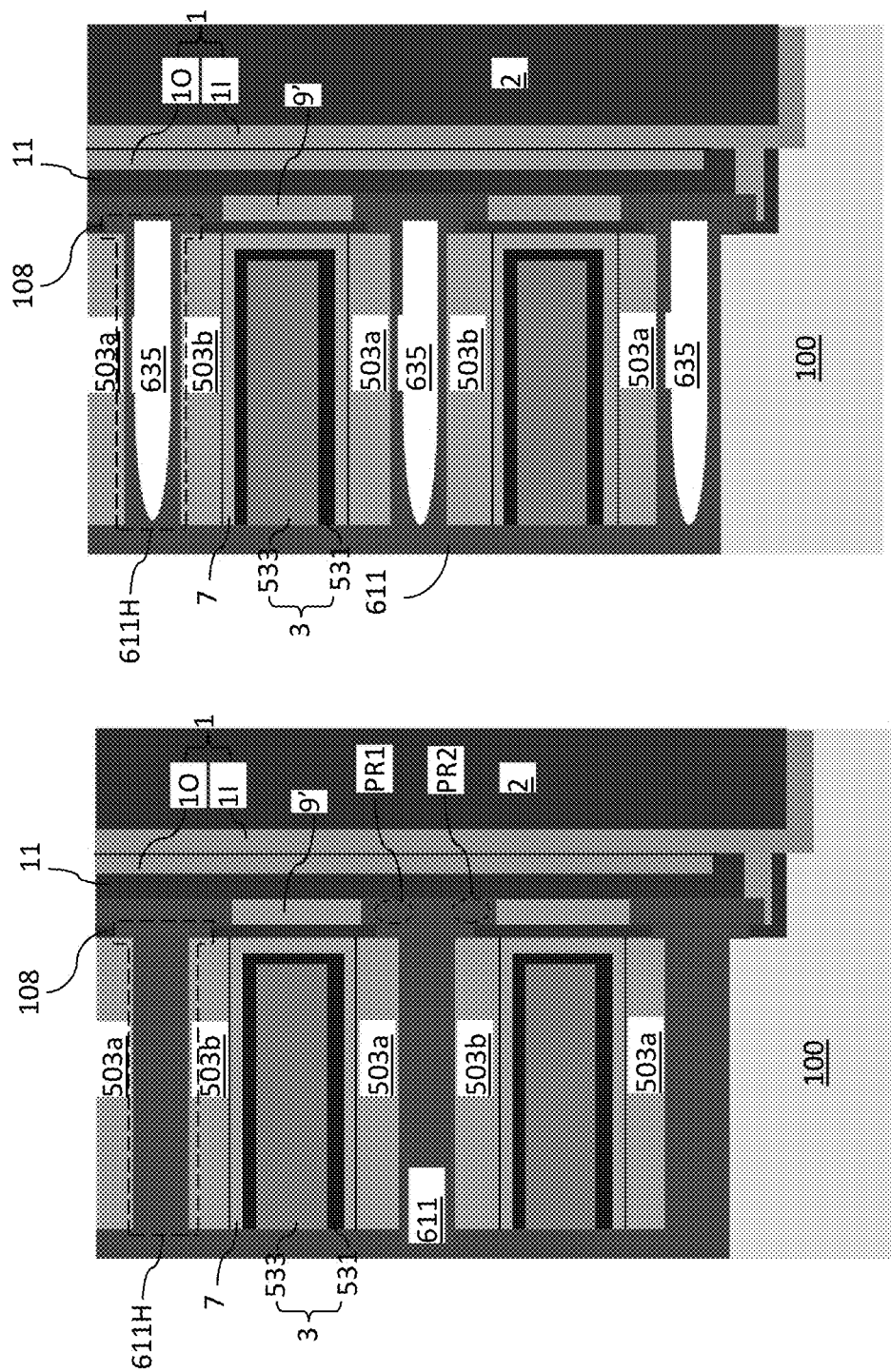

MONOLITHIC THREE-DIMENSIONAL NAND STRINGS AND METHODS OF FABRICATION THEREOF

RELATED APPLICATIONS

The present application is a continuation-in-part (CIP) application of U.S. application Ser. No. 14/468,650 filed on Aug. 26, 2014, the entirety contents of which is incorporated herein by reference.

FIELD

The present disclosure relates generally to the field of semiconductor devices and specifically to monolithic three-dimensional NAND strings and other three-dimensional devices and methods of making thereof.

BACKGROUND

Three-dimensional vertical NAND strings are disclosed in an article by T. Endoh, et al., titled "Novel Ultra High Density Memory With A Stacked-Surrounding Gate Transistor (S-SGT) Structured Cell", IEDM Proc. (2001) 33-36. However, this NAND string provides only one bit per cell. Furthermore, the active region of the NAND string is formed by a relatively difficult and time consuming process involving repeated formation of sidewall spacers and etching of a portion of the substrate, which results in a roughly conical active region shape.

SUMMARY

An embodiment relates to a monolithic three-dimensional NAND string that includes a semiconductor channel where at least one end portion of the semiconductor channel extends substantially perpendicular to a major surface of a substrate. A plurality of control gate electrodes extend substantially parallel to the major surface of the substrate, where each control gate electrode includes a top surface, a bottom surface opposite the substrate and a first side surface facing the at least one end portion of the semiconductor channel. The plurality of control gate electrodes include at least a first control gate electrode located in a first device level and a second control gate electrode located in a second device level located over the major surface of the substrate and below the first device level.

An insulating material layer extends generally parallel to the major surface of the substrate and between the first control gate electrode located in the first device level and the second control gate electrode located in the second device level. The insulating material layer includes a first insulating material portion located adjacent to a bottom surface of the first control gate electrode, a second insulating material portion located adjacent to a top surface of the second control gate electrode, and a third insulating material portion located between the first insulating material portion and the second insulating material portion. The third insulating material portion includes a material that has a dielectric constant that is lower than a dielectric constant of a material of the first insulating layer portion and a dielectric constant of a material of the second insulating layer portion.

At least one charge storage region extends substantially perpendicular to the major surface of the substrate and located adjacent to at least the first side surfaces of each of the control gate electrodes. A blocking dielectric is located adjacent to at least the first side surfaces of each of the control gate electrodes and located between the charge storage region and each of the control gate electrodes. A tunnel dielectric is located between the charge storage region and the semiconductor channel.

Another embodiment relates to a monolithic three-dimensional NAND string that includes a semiconductor channel where at least one end portion of the semiconductor channel extends substantially perpendicular to a major surface of a substrate. A plurality of control gate electrodes extend substantially parallel to the major surface of the substrate, where each control gate electrode includes a top surface, a bottom surface opposite the substrate and a first side surface facing the at least one end portion of the semiconductor channel. The plurality of control gate electrodes include at least a first control gate electrode located in a first device level and a second control gate electrode located in a second device level located over the major surface of the substrate and below the first device level.

A plurality of first insulating material layers extend substantially parallel to the major surface of the substrate between the respective device levels, where each of the plurality of first insulating material layers is adjacent to a bottom surface of the respective one of the plurality of control gate electrodes. A plurality of second insulating material layers extend substantially parallel to the major surface of the substrate between the respective device levels, where each of the plurality of second insulating material layers is adjacent to a top surface of a respective one of the plurality of control gate electrodes. A plurality of air gaps are located between the respective device levels, where each air gap includes a void region enclosed on a top side by a first insulating material layer and on a bottom side by a second insulating material layer, and at least a first portion of the air gap facing the semiconductor channel has a substantially rectangular-shaped cross-section in a plane extending perpendicular to the major surface of the substrate.

At least one charge storage region extends substantially perpendicular to the major surface of the substrate and located adjacent to at least the first side surfaces of each of the control gate electrodes. A blocking dielectric is located adjacent to at least the first side surfaces of each of the control gate electrodes and located between the charge storage region and each of the control gate electrodes. A tunnel dielectric is located between the charge storage region and the semiconductor channel.

Another embodiment relates to a method of making a monolithic three-dimensional NAND string that includes forming a stack of alternating first material layers and second material layers over a major surface of a substrate, where each of the second material layers comprises a layer of a first silicon oxide material between two layers of a second silicon oxide material different from the first silicon oxide material, and the first material layers include a material that is different than the first silicon oxide material and the second silicon oxide material, etching the stack to form a front side opening in the stack, forming at least a portion of a memory film over a sidewall of the front side opening, and forming a semiconductor channel in the front side opening such that at least a portion of the memory film is located between the semiconductor channel and the sidewall of the front side opening, where at least one of an air gap or a material which has a dielectric constant below 3.9 is formed between the respective two layers of second silicon oxide material.

According to an aspect of the present disclosure, a monolithic three-dimensional memory device is provided, which comprises a vertically repeating stack of unit layer stacks, each unit layer stack comprising a conductive material layer, a lower silicon oxide material layer overlying the conductive material layer, a dielectric fill material region overlying the lower silicon oxide material layer, and an upper silicon oxide material layer overlying the dielectric fill material region, a semiconductor channel extending through the vertically repeating stack, at least one end portion of the semiconductor channel extending substantially perpendicular to a top surface of a substrate, and charge storage regions that are located at each level of the electrically conductive layers, laterally surrounding the semiconductor channel, and vertically spaced from one another.

According to another aspect of the present disclosure, a method of forming a monolithic three-dimensional memory device is provided. The method includes forming a stack of alternating first material layers and second material layers over a major surface of a substrate, wherein each of the second material layers comprises a layer of a first silicon oxide material between two layers of a second silicon oxide material different from the first silicon oxide material, and the first material layers comprise a material that is different than the first silicon oxide material and the second silicon oxide material, forming a memory opening through the stack, forming at least a portion of a memory film over a sidewall of the memory opening, forming a semiconductor channel in the memory opening such that at least a portion of the memory film is located between the semiconductor channel and the sidewall of the memory opening, replacing the first material layers with electrically conductive layers, and replacing at least the first silicon oxide material layers with respective insulating layers.

BRIEF DESCRIPTION OF THE DRAWINGS

FIGS. 1A and 1B are respectively side cross sectional and top cross sectional views of a conventional NAND string. FIG. 1A is a side cross sectional view of the device along line Y-Y' in FIG. 1B, while FIG. 1B is a side cross sectional view of the device along line X-X' in FIG. 1A.

FIGS. 2A and 2B are respectively side cross sectional and top cross sectional views of another conventional NAND string. FIG. 2A is a side cross sectional view of the device along line Y-Y' in FIG. 2B, while FIG. 2B is a side cross sectional view of the device along line X-X' in FIG. 2A.

FIG. 3A is a side cross sectional view of a conventional NAND string of an embodiment with a U-shaped channel.

FIGS. 5A-5I illustrate a method of making a NAND string having air gaps between the respective device levels according to one embodiment.

FIGS. 7A-7E illustrate a method of making a NAND string having a low-k insulating material located between the respective device levels according to an embodiment.

FIGS. 8A-8F illustrate a method of making a NAND string having a low-k insulating material located between the respective device levels according to another embodiment.

FIGS. 9A-9G illustrate a method of making a NAND string having discrete charge storage regions and a low-k insulating material between the respective device levels according to an embodiment.

FIG. 9H illustrates an embodiment of a NAND string having discrete charge storage regions and inter-level cavities according to an embodiment.

FIGS. 10A-10C illustrate another method of making a NAND string having discrete charge storage regions and a low-k insulating material between the respective device levels according to an embodiment.

FIG. 10D illustrates another embodiment of a NAND string having discrete charge storage regions and inter-level cavities according to an embodiment.

DETAILED DESCRIPTION

Figure 3B:
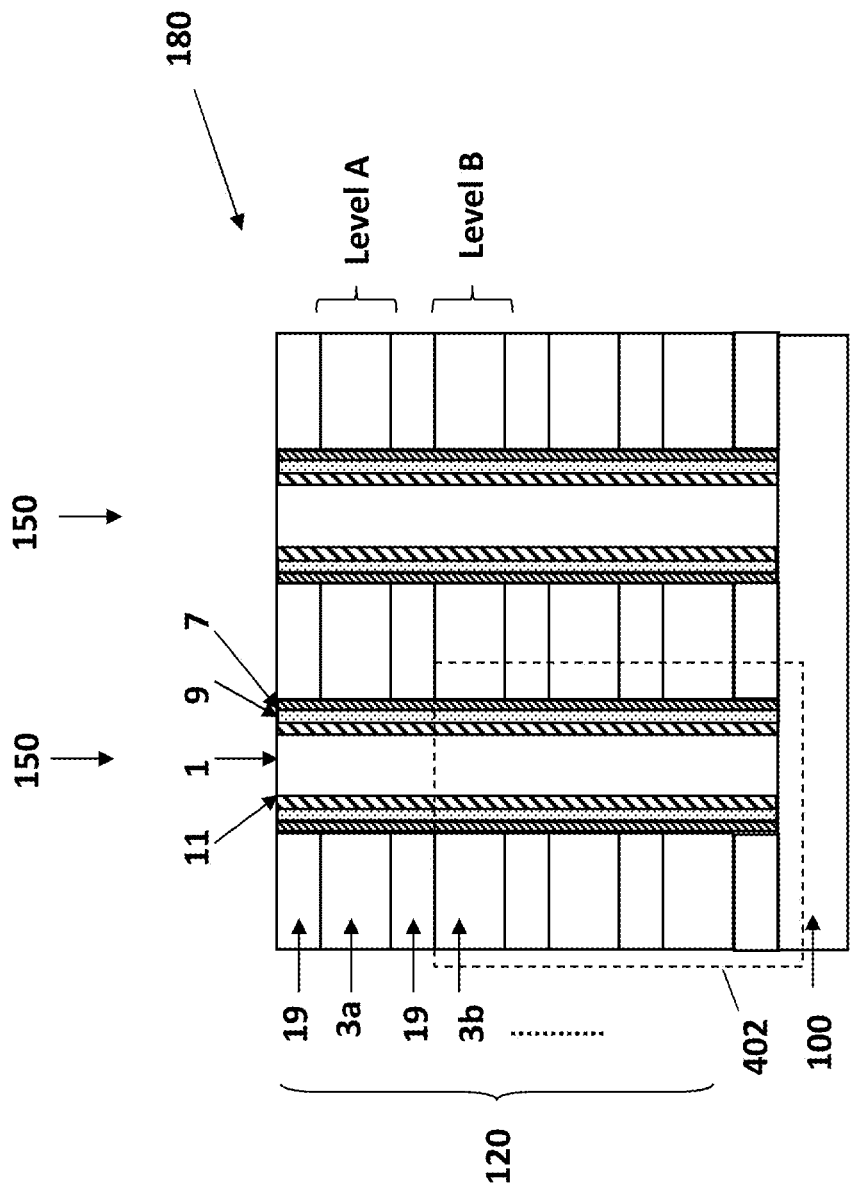
FIG. 3B is a side cross sectional view of another conventional NAND string.

Elements with the same reference numerals refer to the same or similar elements. The same material composition is presumed for elements with the same reference numerals unless expressly described otherwise.

Various embodiments relate to monolithic three-dimensional NAND memory strings and methods of fabricating monolithic three-dimensional NAND memory strings. In one embodiment, air gaps are formed between control gate electrodes through the backside opening. In another embodiment a low-k dielectric is enclosed between two layers of silicon oxide material located between control gate electrodes.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and adhering the memory levels atop each other, as in Leedy, U.S. Pat. No. 5,915,167, titled "Three-dimensional Structure Memory." The substrates may be thinned or removed from the memory levels before bonding, but as the memory levels are initially formed over separate substrates, such memories are not true monolithic three-dimensional memory arrays.

As used herein, a "vertically repeating stack" refers to a structure in which instances of a unit layer stack are repeated along a vertical direction. A "unit layer stack" refers to a unit of repetition within a vertically repeating stack, and includes a stack of at least two layers.

In some embodiments, the monolithic three-dimensional NAND string 150 comprises a semiconductor channel 1 having at least one end portion extending substantially perpendicular to a major surface 100a of a substrate 100, as shown in FIGS. 1A, 2A and 3B. "Substantially perpendicular to" (or "substantially parallel to") means within 0-10°. For example, the semiconductor channel 1 may have a pillar shape extending through a plurality of memory device levels (Level A, Level B, etc.) and the entire pillar-shaped semiconductor channel in the memory device levels extends substantially perpendicularly to the major surface 100a of the substrate 100, as shown in FIGS. 1A, 2A and 3B. The channels 1 may be electrically connected to first and second (e.g., source and drain) electrodes 102, 202 which are schematically shown in FIGS. 1A and 2A. The first (e.g., source) electrode 102 may connect to the bottom of the channel 1 and the second (e.g., drain electrode 202) may connect to the top of the channel 1. The NAND string 150 may further include drain-side and source-side select or access transistors (not shown in FIGS. 1A, 2A and 3B for clarity) which may be located above and below the memory levels of the NAND string 150, respectively.

Alternatively, the semiconductor channel 1 may have a U-shaped pipe shape, as shown in FIG. 3A. The two wing portions 1a and 1b of the U-shaped pipe shape semiconductor channel may extend substantially perpendicular to the major surface 100a of the substrate 100, and a connecting portion 1c of the U-shaped pipe shape semiconductor channel 1 connects the two wing portions 1a, 1b extends substantially parallel to the major surface 100a of the substrate 100. In these embodiments, one of the source or drain electrodes $202_1$ contacts the first wing portion of the semiconductor channel from above, and another one of a source or drain electrodes $202_2$ contacts the second wing portion of the semiconductor channel 1 from above. An optional body contact electrode (not shown) may be disposed in the substrate 100 to provide body contact to the connecting portion of the semiconductor channel 1 from below. The NAND string 150 in this embodiment may further include drain-side and source-side select or access transistors (not shown in FIG. 3A for clarity), both of which may be located above the memory levels of the NAND string 150 and electrically connected to the respective wing portions 1a and 1b of the semiconductor channel 1.

In some embodiments, the semiconductor channel 1 may be a filled feature, as shown in FIGS. 2A, 2B, 3A and 3B. In some other embodiments, the semiconductor channel 1 may be hollow, for example a hollow cylinder filled with an insulating fill material 2, as shown in FIGS. 1A-1B. In these embodiments, an insulating fill material 2 may be formed to fill the hollow part surrounded by the semiconductor channel 1. The U-shaped pipe shape semiconductor channel 1 shown in FIG. 3A and/or the channel 1 shown in FIG. 3B may alternatively be a hollow cylinder filled with an insulating fill material 2, shown in FIGS. 1A-1B.

A memory array 180 may comprise a plurality of NAND strings 150 formed in a stack 120 of material layers over the substrate 100. The substrate 100 can be any semiconducting substrate known in the art, such as monocrystalline silicon, IV-IV compounds such as silicon-germanium or silicon-germanium-carbon, III-V compounds, II-VI compounds, epitaxial layers over such substrates, or any other semiconducting or non-semiconducting material, such as silicon oxide, glass, plastic, metal or ceramic substrate. The substrate 100 may include integrated circuits fabricated thereon, such as driver circuits for a memory device.

Any suitable semiconductor materials can be used for semiconductor channel 1, for example silicon, germanium, silicon germanium, or other compound semiconductor materials, such as III-V, II-VI, or conductive or semiconductive oxides, etc. The semiconductor material may be amorphous, polycrystalline or single crystal. The semiconductor channel material may be formed by any suitable deposition methods. For example, in one embodiment, the semiconductor channel material is deposited by low pressure chemical vapor deposition (LPCVD). In some other embodiments, the semiconductor channel material may be a recrystallized polycrystalline semiconductor material formed by recrystallizing an initially deposited amorphous semiconductor material.

The insulating fill material 2 may comprise any electrically insulating material, such as silicon oxide, silicon nitride, silicon oxynitride, or other high-k insulating materials.

The monolithic three-dimensional NAND string further comprise a plurality of control gate electrodes 3, as shown in FIGS. 1A-1B, 2A-2B, 3A and 3B electrically separated from each other by a plurality of electrically insulating layers 19 forming a stack 120 of alternating control gate electrodes 3 and insulating layers 19. The control gate electrodes 3 may comprise a portion having a strip shape extending substantially parallel to the major surface 100a of the substrate 100. The plurality of control gate electrodes 3 comprise at least a first control gate electrode 3a located in a first device level (e.g., device level A) and a second control gate electrode 3b located in a second device level (e.g., device level B) located over the major surface 100a of the substrate 100 and below the device level A. The control gate material may comprise any one or more suitable conductive or semiconductor control gate material known in the art, such as doped polysilicon, tungsten, tungsten nitride, copper, aluminum, tantalum, titanium, cobalt, titanium nitride or alloys thereof or combination of these materials. For example, the control gate material in FIGS. 1A, 2A and 3A may comprise a conductive metal or metal alloy, such as tungsten and/or titanium nitride, while the control gate material in FIG. 3B may comprise doped polysilicon.

A blocking dielectric 7 is located adjacent to the control gate(s) 3 and may surround the control gate 3, as shown in FIGS. 1A, 2A and 3A. Alternatively, a straight blocking dielectric layer 7 may be located only adjacent to an edge (i.e., minor surface) of each control gate 3, as shown in FIG. 3B. The blocking dielectric 7 may comprise one or more layers having a plurality of blocking dielectric segments located in contact with a respective one of the plurality of control gate electrodes 3, for example a first dielectric segment 7a located in device level A and a second dielectric segment 7b located in device level B are in contact with control electrodes 3a and 3b, respectively, as shown in FIG. 3A. Alternatively, the blocking dielectric 7 may be a straight, continuous layer, as shown in FIG. 3B, similar to the device described in U.S. Pat. No. 8,349,681 issued on Jan. 8, 2013 and incorporated herein by reference in its entirety.

The monolithic three-dimensional NAND string also comprises a charge storage region 9. The charge storage region 9 may comprise one or more continuous layers which extend the entire length of the memory cell portion of the NAND string, as shown in FIG. 3B. For example, the charge storage region 9 may comprise an insulating charge trapping material, such as a silicon nitride layer.

Alternatively, the charge storage region may comprise a plurality of discrete charge storage regions or segments 9 located between the blocking dielectric and the channel 1, as shown in FIGS. 1A, 2A and 3A. The plurality of discrete charge storage regions 9 comprise at least a first discrete charge storage region 9a located in the device level A and a second discrete charge storage region 9b located in the device level B, as shown in FIG. 3A. The discrete charge storage regions 9 may comprise a plurality of vertically spaced apart, conductive (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof), or semiconductor (e.g., polysilicon) floating gates. Alternatively, the discrete charge storage regions 9 may comprise an insulating charge trapping material, such as silicon nitride segments. Alternatively, the charge storage region 9 may comprise conductive nanoparticles, such as metal particles, for example ruthenium nanoparticles.

The tunnel dielectric 11 of the monolithic three-dimensional NAND string is located between charge storage region 9 and the semiconductor channel 1.

The blocking dielectric 7 and the tunnel dielectric 11 may be independently selected from any one or more same or different electrically insulating materials, such as silicon oxide, silicon nitride, silicon oxynitride, or other insulating materials, such as metal oxide materials, for example aluminum oxide or hafnium oxide. The blocking dielectric 7 and/or the tunnel dielectric 11 may include multiple layers of silicon oxide, silicon nitride and/or silicon oxynitride (e.g., ONO layers).

Figure 4:
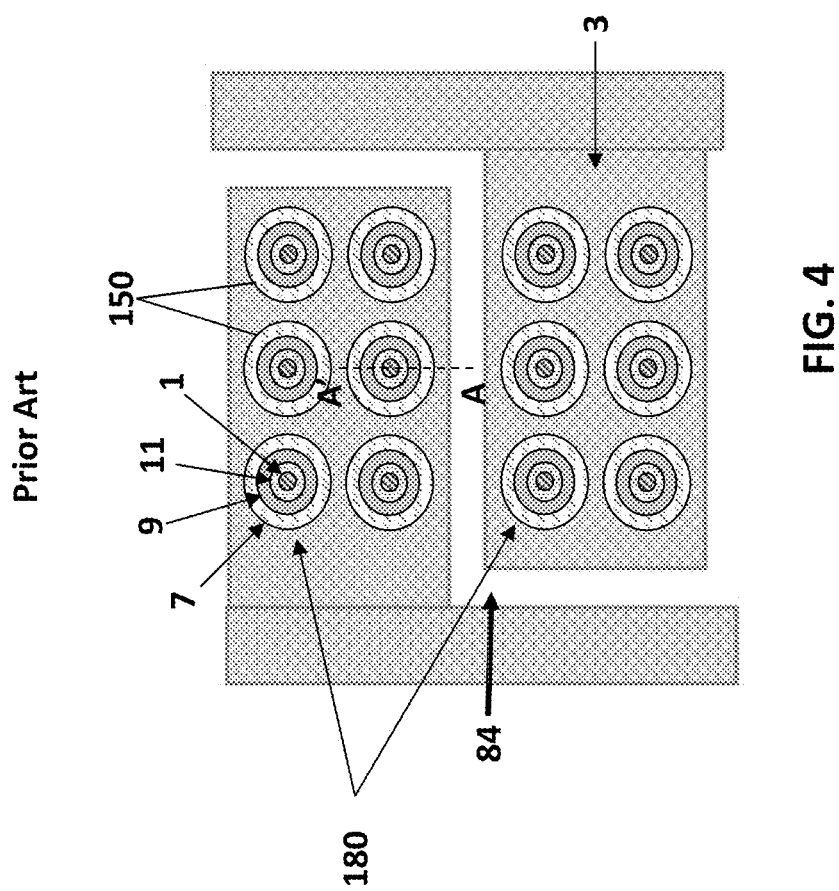
FIG. 4 is a top schematic view of a portion of a conventional memory device comprising NAND strings.

FIG. 4 is a top schematic view illustrating a portion of a conventional memory device comprising one or more arrays 180 of NAND strings 150 having channels 1 located in respective memory holes 81 (e.g., front side openings). In this device, the memory holes 81 are circular, thereby resulting in cylindrical pillar shaped NAND strings 150. From the top view, the tunnel dielectric 11, charge storage region 9 and blocking dielectric 7 form concentric rings around the channel 1. The control gate 3 in each device level is generally slab shaped. A backside opening 84, such as a trench, electrically separates adjacent control gates 3 and arrays 180 (e.g., memory blocks) of NAND strings 150 from each other. As discussed in more detail below, the backside opening 84 may be used in the manufacture of NAND strings 150 according to some embodiments.

A first embodiment method of making a NAND string 150 is illustrated in FIGS. 5A-5I. In some embodiments, the methods described herein may be used to make a NAND string 150 having reduced capacitance between the control gates/word lines, which may improve program speed and device performance in three-dimensional NAND string memory devices. In this embodiment, air gaps are formed within the insulating layers separating the control gates in the respective device levels.

Figure 5D:
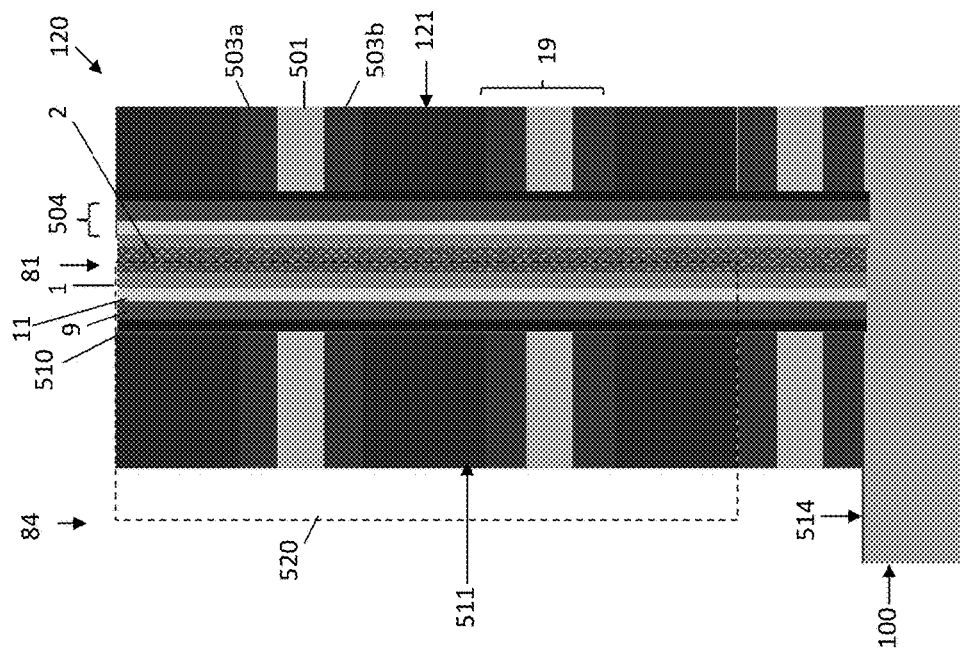

FIGS. 5A-5I are side cross-sectional views illustrating the formation of a portion of a NAND string array 180 that substantially corresponds to region 402 shown in dashed lines in FIG. 3B and taken along line A-A' in the top schematic view of FIG. 4. As illustrated in FIG. 5A, the method includes forming a stack 120 of alternating first material layers 121 and second material layers 19 over a major surface 100a of substrate 100. Each of the second material layers 19 includes a layer 501 of a first silicon oxide material between two layers 503a, 503b of a second silicon oxide material that is different from the first silicon oxide material. The layers 503a, 503b of the second silicon oxide material may be formed of the same silicon oxide material or of different silicon oxide materials that are each different from the first silicon oxide material. The layers 121, 501, 503a, 503b may be formed by a suitable deposition method, such as sputtering, CVD, PECVD, MBE, ALD, etc.

In one embodiment, the first material layers 121 comprise a material that is different than the first silicon oxide material and the second silicon oxide material. The first material layers 121 may comprise a sacrificial material, such as an insulating material that is different from the material of layers 501, 503a, 503b. For example, layers 501, 503a, 503b may comprise silicon oxide and layers 121 may comprise silicon nitride forming an ONON stack 120. Alternatively, layers 501, 503a, 503b may comprise silicon oxide and layers 121 may comprise polysilicon forming an OPOP stack 120.

In this embodiment, the layers 501 of the first silicon oxide material have a higher etch rate than the layers 503a, 503b of the second silicon oxide material when exposed to the same etching medium. Silicon oxide materials that may be used include, but are not limited to, dichlorosilane (DCS, $H_2SiCl_2$) based silicon oxides, disilane (DS, $Si_2H_6$) based silicon oxides, high aspect ratio process (HARP) non-plasma based CVD using tetraethyl orthosilicate (TEOS) and ozone sources based silicon oxides, high density plasma (HDP) CVD based silicon oxides, TEOS based silicon oxides and borosilicate glass (BSG) or borophosphosilicate glass (BPSG). Selective etching of silicon oxide materials may be performed by chemical dry etching or wet etching techniques. Example silicon oxide combinations which may be suitable for use with selective dry etching techniques are summarized in Table 1 below while combinations which may be suitable for use with wet etching techniques are summarized in Table 2 below.

TABLE 1

| | Etch Selectivity | Etching Method |
|---|---|---|
| DCS Oxide:DS Oxide | 5:1-32:1 (tunable) | CDE (Chemical Dry Etching) |
| HARP:HDP Oxide | 230:1 | CDE (Chemical Dry Etching) |

TABLE 2

| Etch Selectivity (BPSG:TEOS) | Wet etch Method 99.7% Acetic acid:49% HF ratio |
|---|---|
| 27:1 | 200:1 |
| 42:1 | 100:1 |
| 55:1 | 50:1 |

As can be seen in Tables 1 and 2 above, the selectivity among the silicon oxide pairs may range from 5:1 to 230:1. Further, in the case of DCS:DS, the selectivity is tunable. That is, the selectivity between DCS and DS may be chosen based on the etching conditions, e.g. temperature, etchant composition, etc. In an embodiment, selectively removing a first silicon oxide material relative to a second silicon oxide material may include selective etching using a $HF:H_2O$ in a 1:5-15 ratio or a $HF:C_2H_4O_2$ in a 1:40-60 ratio dry etch chemistry using any suitable etching system, such as the Frontier® CDE system from Applied Materials, Inc.

In one embodiment, the layers 501 of first silicon oxide material may comprise silicon oxide deposited by CVD using a dichlorosilane ($H_2SiCl_2$) source, and the layers 503a, 503b of second silicon oxide material may comprise silicon oxide deposited by CVD using a disilane ($Si_2H_6$) source. In another embodiment, the layers 501 of first silicon oxide material may comprise silicon oxide deposited by High Aspect Ratio Process (HARP) non-plasma based CVD using TEOS and ozone sources, and the layers 503a, 503b of second silicon oxide material may comprise silicon oxide deposited by high density plasma (HDP) CVD. In another embodiment, the layers 501 of first silicon oxide material may comprises borosilicate glass or borophosphosilicate glass, and the layers 503a, 503b of second silicon oxide material may comprise silicon oxide deposited using a TEOS source.

In further embodiments, the layers 501 of first silicon oxide material may comprise silicon oxide that is doped with a material that increases the etch rate of the material. For example, the layers 501 of first silicon oxide material may comprise silicon oxide that is doped with at least one of boron and phosphorus. The layers 503a, 503b of second silicon oxide material may comprise silicon oxide that is not doped with boron or phosphorus (or is doped at a significantly lower level, such as by a factor of 10 or more, relative to the first silicon oxide material).

The various silicon oxide materials discussed above may be deposited by any suitable manner, such as low pressure chemical vapor deposition (LPCVD), plasma enhanced chemical vapor deposition (PECVD), chemical vapor deposition (CVD), and atmospheric pressure chemical vapor deposition (APCVD). Table 3 below summarizes some of the process parameters (i.e., reactor type, temperature, pressure, reactant gases and flow ratios) which may be suitable for deposition of the above described silicon oxide materials.

TABLE 3

| Oxide Type | CVD Reactor Type | Temperature | Pressure | Reactant gases & flow ratio |
|---|---|---|---|---|
| DCS Oxide | LPCVD | 700-900° C. | 125 mT-1 T | $DCS:N_2O$ = 0.25-1 |
| DS Oxide | PECVD | ~300° C. | 700 mT | $DS:N_2O$ = 3:1 |
| HARP (TEOS + Ozone) | Non-plasma based CVD | ~400° C. | 760 T (atmospheric) | TEOS and $O_3$ |
| HDP Oxide | PECVD | 300-400° C. | 2-10 T | Ar, $TEOS(SiH_4)$ & $O_2$ |
| TEOS | PECVD | <600° C. | 2-10 T | $TEOS:O_2$ = 1:10-1:20 |
| BPSG | PECVD | 300-500° C. | | $B_2H_6$, Phosphine & $SiH_4$ |
| BPSG | APCVD | 300-500° C. | 760 T | $B_2H_6$, Phosphine & $SiH_4$ |

The formation of layers 121, 501, 503a, 503b may be followed by etching the stack 120 to form at least one front side opening 81 in the stack 120. A single front side opening 81 is illustrated in FIG. 5B. In embodiments, an array of front side openings 81 (e.g., cylindrical memory openings or holes) may be formed in locations where vertical channels of NAND strings 150 will be subsequently formed.

The front side openings 81 may be formed by photolithography and etching as follows. First, a memory hole mask (not shown in FIGS. 5A-B) may be formed over the stack 120 and patterned to form openings corresponding to the future locations of the front side openings 81. The mask may comprise any suitable material, such as one or more layer of photoresist and/or hard mask material. Then, the stack 120 may be etched (e.g., using reactive ion etching (RIE)) to form at least one opening 81 in the stack as shown in FIG. 5B. In the embodiment of FIG. 5B, the etching may be stopped at the substrate 100. Alternatively, an etch stop layer may be formed over the substrate and the etching may be stopped on the etch stop layer. Following the etching to form the front side memory openings 81, the mask may be removed.

Each of the front side memory openings 81 may include a sidewall 507 defined by the exposed surfaces of the layers 121, 501, 503a, 503b of the stack 120 and a bottom surface 508, which in this embodiment is defined by the exposed surface of the substrate 100.

Figure 5C:
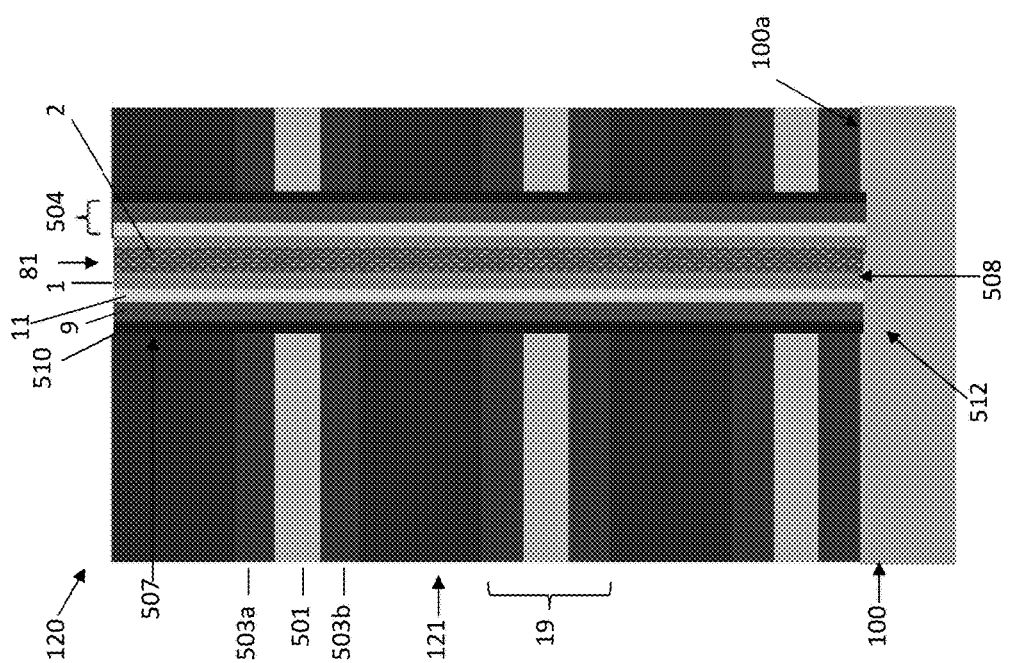

A cover layer 510 which may comprise an insulating material (e.g., silicon oxide) may be formed over at least the sidewalls 507 of the front side openings 81 in the stack 120, as shown in FIG. 5C. In embodiments, the cover layer 510 may be formed over the stack 120 including over the sidewalls 507 and bottom surfaces 508 of each of the front side openings 81. Optionally, an anisotropic etching process (e.g., an RIE process) may be performed to remove the cover layer 510 from the top surface of the stack 120 and from the bottom surface 508 of the front side openings 81, while the cover layer 510 may remain over the sidewalls 507 of the front side openings 81. Alternatively, the etching process may be combined with the memory film etching process described below.

Referring again to FIG. 5C, at least a portion of a memory film 504 may be formed over the cover layer 510 on at least the sidewalls 507 of the front side openings 81. In this embodiment, the memory film 504 includes a charge storage material 9 formed over the cover layer 510 and a tunnel dielectric 11 formed over the charge storage material 9. In embodiments, the memory film 504 may be formed over the stack 120 including over the sidewalls 507 and bottom surfaces 508 of each of the front side openings 81, and an anisotropic etching process (e.g., an RIE process) may be performed to remove the memory film 504 from the top surface of the stack 120 and from the bottom surface 508 of the front side openings 81, while the memory film 504 may remain over the sidewalls 507 of the front side openings 81. If the cover layer 510 was not removed previously from the bottom surface 508, then it may be removed from the bottom surface 508 together with the memory film 504 in the same anisotropic etching process.

In embodiments, the charge storage material 9 of the memory film 504 may comprise a continuous dielectric charge trap layer (e.g., a silicon nitride layer) that extends over the sidewall 507 of the front side opening 81 substantially perpendicular to the major surface 100a of the substrate 100. In other embodiments, the charge storage material 9 may comprise a plurality of spaced apart floating gates (e.g., comprising a semiconductor material, such as polysilicon or silicon germanium, or a metal or metal alloy, such as a metal nitride or metal silicide). The tunnel dielectric 11 may comprise a layer of an insulating material (e.g., an oxide layer, such as a silicon oxide or silicon oxynitride layer).

Referring again to FIG. 5C, a semiconductor channel 1 (e.g. a polysilicon or amorphous silicon layer) may be formed over the stack 120 including over the at least one memory film 504 along the sidewalls 507 of the front side openings 81. The semiconductor channel 1 may extend substantially perpendicular to the major surface 100a of the substrate 100, and at least a portion of the memory film 504 may be located between the semiconductor channel 1 and the sidewall 507 of the front side opening 81. The semiconductor channel 1 may contact the exposed surface of the substrate 100 at the bottom surfaces 508 of the front side openings 81, as shown in FIG. 5C. Optionally, the semiconductor channel 1 may contact a semiconductor channel portion of a lower (e.g., source-side) select gate transistor (not shown in FIG. 5C for clarity). The semiconductor channel portion of the lower select gate transistor may be formed as a protrusion extending from the major surface 100a of the substrate 100 or may be located within the semiconductor substrate 100, and may define the bottom surfaces 508 of the respective memory openings 81. The semiconductor channel portion of the lower select gate transistor may electrically couple the vertically-oriented semiconductor channel 1 extending within the front side opening 81 to a horizontal channel portion 512 located on or within the substrate 100 and extending substantially parallel to the major surface 100a of the substrate 100. Examples of suitable configurations and methods for making the lower (e.g., source side) select transistors of a monolithic three-dimensional array of vertical NAND strings 150 are described, for example, in U.S. patent application Ser. No. 14/133,979, filed on Dec. 19, 2013, U.S. patent application Ser. No. 14/225,116, filed on Mar. 25, 2014, U.S. patent application Ser. No. 14/225,176, filed on Mar. 25, 2014, and U.S. Provisional Patent Application No. 61/977,173, filed on Apr. 9, 2014, all of which are incorporated by reference herein for all purposes.

An optional insulating fill material 2 (e.g., an oxide, such as silicon oxide) may be formed over the semiconductor channel 1 and fill the front side openings 81, as shown in FIG. 5C.

Referring to FIG. 5D, the stack 120 may be etched (e.g., through a mask patterned by photolithography, not shown in FIG. 5D) to form one or more backside openings (e.g., trenches) 84 in the stack 120. In this embodiment, the backside opening (e.g., trench) 84 extends through the entire stack 120 to the semiconductor substrate 100. The layers 121, 501, 503a, 503b of the stack 120 may at least partially define at least one sidewall 511 of the backside opening 84, and the substrate 100 may define the bottom surface 514 of the backside opening 84. Region 520 shown in dashed lines will be described below in connection with FIGS. 6A-8F.

Figure 5F:
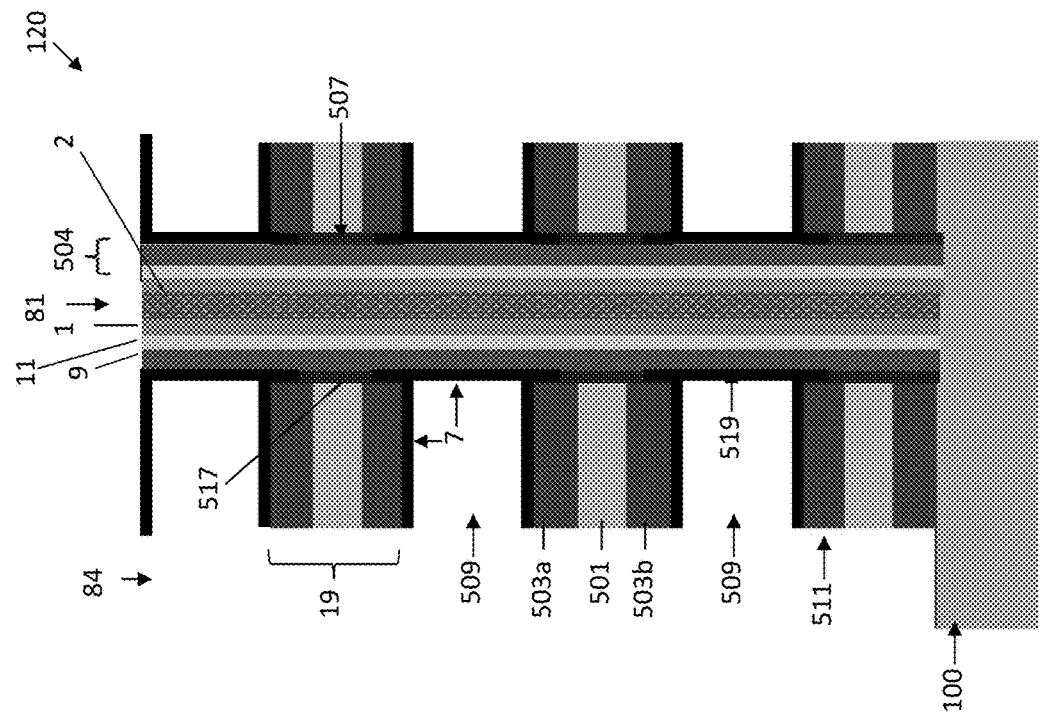
Figure 5E:
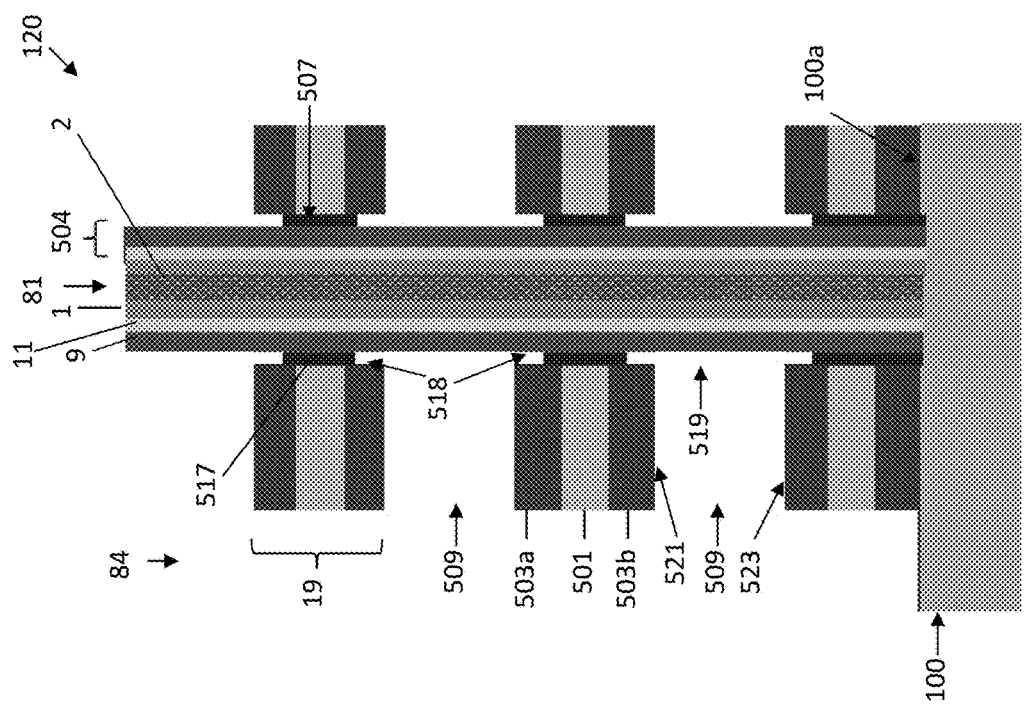

Referring to FIG. 5E, at least a portion of the first material layers 121 may be removed through the backside opening 84 to form backside recesses 509 between the second material layers 19. Layers 121 may be removed by selective etching, such as a silicon nitride selective etching (e.g., a hot phosphoric acid wet etch) which removes silicon nitride layers 121 but does not remove the silicon oxide material of layers 19.

As shown in FIG. 5E, portions of the cover layer 510 adjacent to the first material layers 121 may be removed by etching to expose the memory film 504 (e.g., the charge storage material 9) over a first side surface 519 of each of the backside recesses 509. The removal of portions of the cover layer 510 may provide vertically spaced-apart segments 517 of the cover layer 510 that extend substantially perpendicular to the major surface 100a of the substrate 100 and over the sidewalls 507 of the memory openings 81. The portions of the cover layer 510 may be removed during the same etching step during which layers 121 are removed, or during a different etching step. The etching may also remove portions of the cover layer 510 that are adjacent to the layers 503a, 503b of the second silicon oxide material to provide void areas 518 between at least a portion of each of the layers 503a, 503b of second silicon oxide material and the memory film 504, as shown in FIG. 5E. The spaced apart segments 517 of the cover layer 510 may be located between the memory film 504 and each of the layers 501 of the first silicon oxide material.

Referring to FIG. 5F, a blocking dielectric 7 may be formed in the backside recesses 509 through the backside opening 84. The blocking dielectric 7 may be formed over the exposed memory film 504 on the first side surfaces 519 of each of the backside recesses 509 and within the void areas 518 between the memory film 504 and layers 503a, 503b. The spaced apart segments 517 of the cover layer 510 may be located between respective portions of the blocking dielectric 7 that extend along the sidewall 507 of the front side opening 81. The blocking dielectric 7 may also be formed adjacent to the layers 503b of the second silicon oxide material on the top surfaces 521 of the backside recesses 509 and adjacent to the layers 503a of the second silicon oxide material on the bottom surfaces 523 of the backside recesses 509. The blocking dielectric 7 may comprise a single layer or a stack of at least two layers of different insulating materials. For example, the different insulating materials may include silicon oxide, silicon nitride, silicon oxynitride and/or a high-k material such as $Al_2O_3$, $HfO_2$, HfSiO, $TaO_2$ or other metal oxides. In one embodiment, the blocking dielectric 7 may include a stack comprising at least one layer of silicon oxide and at least one layer of a metal oxide, such as aluminum oxide and/or hafnium oxide.

In this embodiment, any blocking dielectric 7 located within the backside opening 84, including on the sidewall 511 of the backside opening 84 may be removed from the backside opening 84 (e.g., by etching) as shown in FIG. 5F.

Referring to FIG. 5G, control gate electrodes 3 may be formed over the blocking dielectric 7 in the backside recesses 509 through the backside opening 84. Each of the control gate electrodes 3 may include a top surface 525, a bottom surface 527 opposite the top surface 525, and a first side surface 529 facing the vertically-extending semiconductor channel 1 in the memory opening 81. The control gate electrodes 3 may be formed over the blocking dielectric 7 such that the blocking dielectric 7 surrounds each of the control gate electrodes 3 on the top 525, bottom 527 and first side surfaces 529 of the control gate electrode 3. Each of the first material layers 19 of the stack 120 may be separated from the adjacent control gate electrode(s) 3 by the blocking dielectric 7. Each of the control gate electrodes 3 may be located in a respective device level (e.g., Level A, Level B, etc. as shown in FIGS. 1A, 2A, 3A and 3B) over the major surface 100a of the substrate 100.

Each of the control gate electrodes 3 may comprise one or more electrically conductive materials, such as a metal, metal nitride, metal silicide or heavily doped semiconductor material. In one embodiment, the control gate electrodes 3 are formed by depositing a metal nitride liner material 531 (e.g., tungsten nitride (WN) or titanium nitride (TiN) liner) over the blocking dielectric 7 in the backside recesses 509, followed by depositing a metal material 533 (e.g., tungsten) over the metal nitride liner material 531 to fill the backside recesses 509. Any of the metal material 533 and/or metal nitride liner material 531 located in the backside opening 84 may be removed from the backside opening 84 (e.g., via one or more etching steps) as shown in FIG. 5G.

Referring to FIG. 5H, at least a portion of the layers 501 of first silicon oxide material may be removed by etching through the backside opening 84 to form second backside recesses 515 within the second material layers 19 of the stack 120. Each of the second backside recesses 515 may be located between the layers 503a, 503b of the second silicon oxide material. As discussed above, the first silicon oxide material of layers 501 may have a higher etch rate than the second silicon oxide materials of layers 503a, 503b. Thus, layers 501 may be selectively etched relative to layers 503a, 503b to form the second backside recesses 515 between layers 503a and 503b. Suitable selective dry and wet chemical etching techniques for silicon oxide materials are described above, for example, with reference to Tables 1 and 2.

In the embodiment shown in FIG. 5H, the layers 501 of first silicon oxide material may be completely removed to expose the segments 517 of the cover layer 510 in the second backside recesses 515.

Figure 5I:
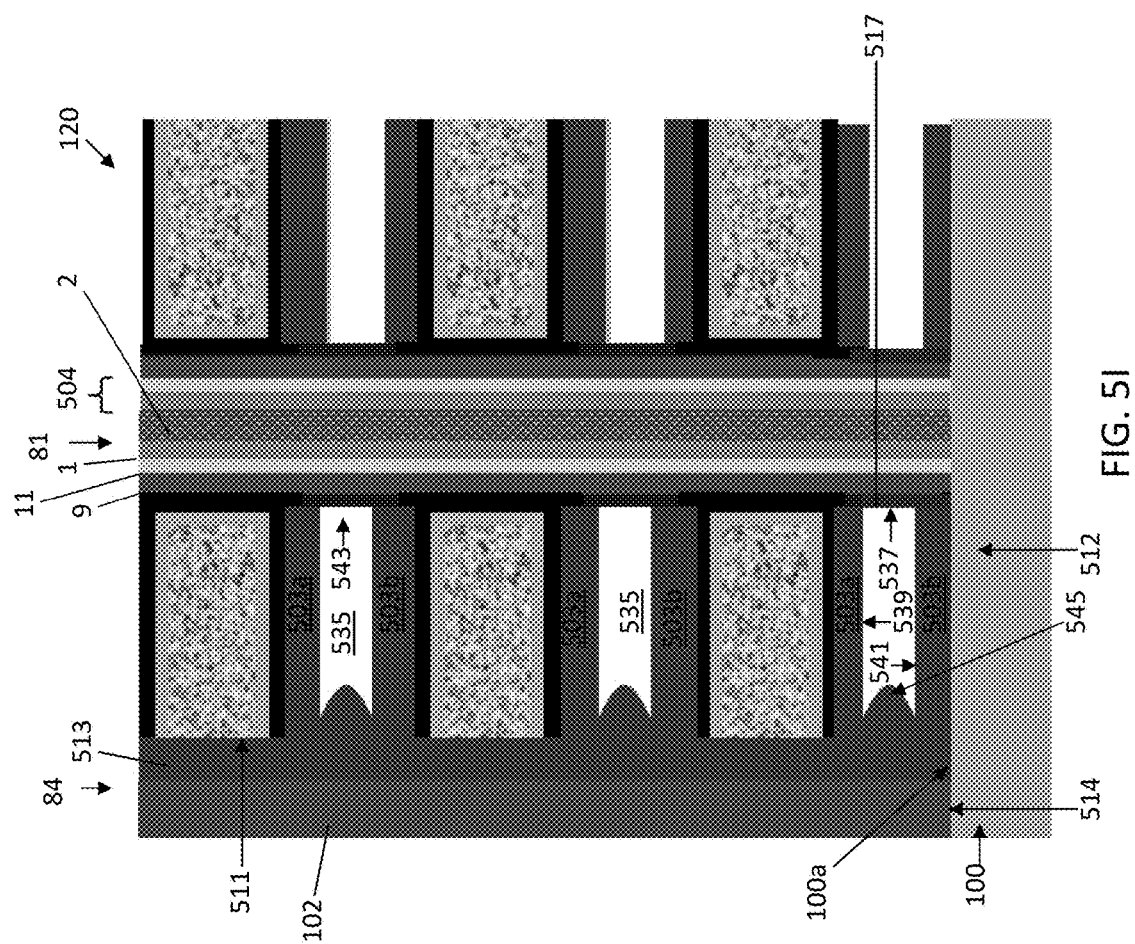

Referring to FIG. 5I, a layer of insulating material 513 may be formed over the sidewall 511 of the backside opening 84 to enclose the second backside recesses 515 and form air gaps 535 between the respective layers 503a, 503b of the second silicon oxide material. Each of the air gaps 535 may comprise a void region enclosed on a first side 537 by a segment 517 of the cover layer 510, on a top side 539 by a layer 503a of the second silicon oxide material and on a bottom side 541 by a layer 503b of the second silicon oxide material. As shown in FIG. 5I, at least a first portion 543 of the air gaps 535 facing the semiconductor channel 1 may have a substantially rectangular-shaped cross-section in a plane extending perpendicular to the major surface 100a of the substrate 100 (e.g., a plane which extends from the backside opening 84 to the front side opening 81 perpendicular to the major surface 100a of the substrate 100). A substantially rectangular-shaped cross-section includes an exactly rectangular-shaped cross-section or a cross-section which deviates from the exact rectangular shape due to: (i) unintentional etching of layers 503a, 503b and/or 517 during the selective etching to remove layers 501 (due to unavoidable non-uniformity and/or limited selectivity of the etch) which results in nanoscale curvature of layers 503a, 503b and/or 517 in region 543; (ii) due to the unavoidable nanoscale non-uniformity of cover layer 510 thickness that results during deposition of layer 510 into opening 81; and/or (iii) due to unavoidable nanoscale non-uniformity or curvature of the sidewall 507 of the front side opening 81 that results during etching of the opening 81.

Each of the air gaps 535 may be enclosed on a second side 545 of the air gap 535 opposite the semiconductor channel 1 by the layer of insulating material 513. In embodiments, the insulating material 513 may define a substantially concave second side surface 545 of the air gap 535, as shown in FIG. 5I, because layer 513 protrudes into the air gaps 535.

A source side electrode 102 (i.e., source line) comprising an electrically conductive material may be formed within the backside opening 84, as shown in FIG. 5I. The layer of insulating material 513 may electrically insulate the source side electrode 102 from the plurality of control gates 3 along the sidewall 511 of the backside opening 84. The source side electrode 102 may comprise one or more electrically conductive materials, such as a metal, metal nitride, metal silicide, heavily doped semiconductor material, or combinations thereof. In embodiments, the source side electrode 102 may be formed in contact with a source region (e.g., a doped region of the substrate 100 which is implanted into the substrate through the backside opening 84, not shown in FIG. 5I) located at the bottom 514 of the backside opening 84. The source side electrode 102 may electrically contact the semiconductor channel 1 from below the device levels of the NAND string 150 via the source region and the horizontal channel portion 512 extending on or within the substrate 100.

Figure 6B:
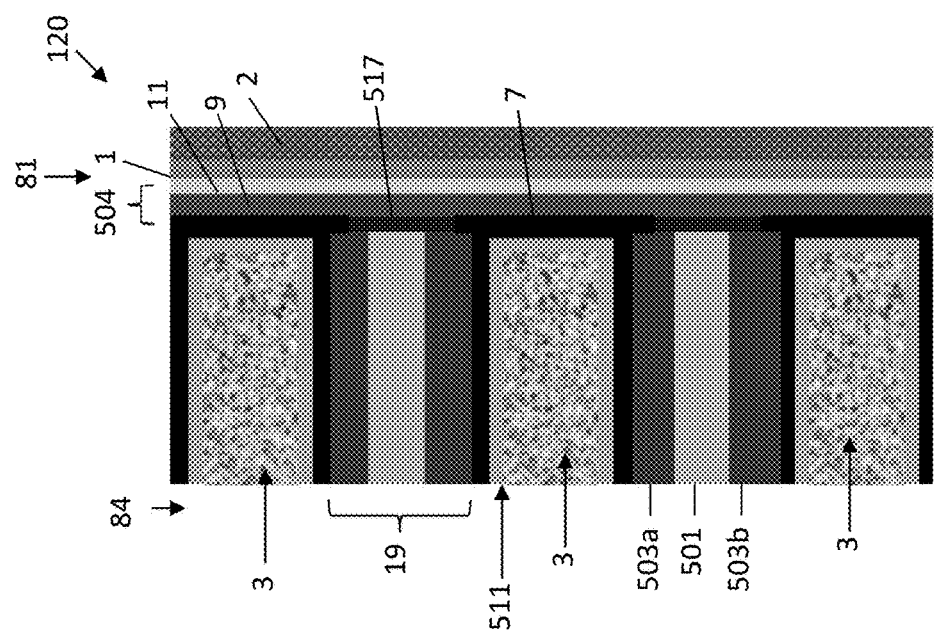
FIGS. 6A-6D illustrate a method of making a NAND string having air gaps between the respective device levels according to another embodiment.
Figure 6A:
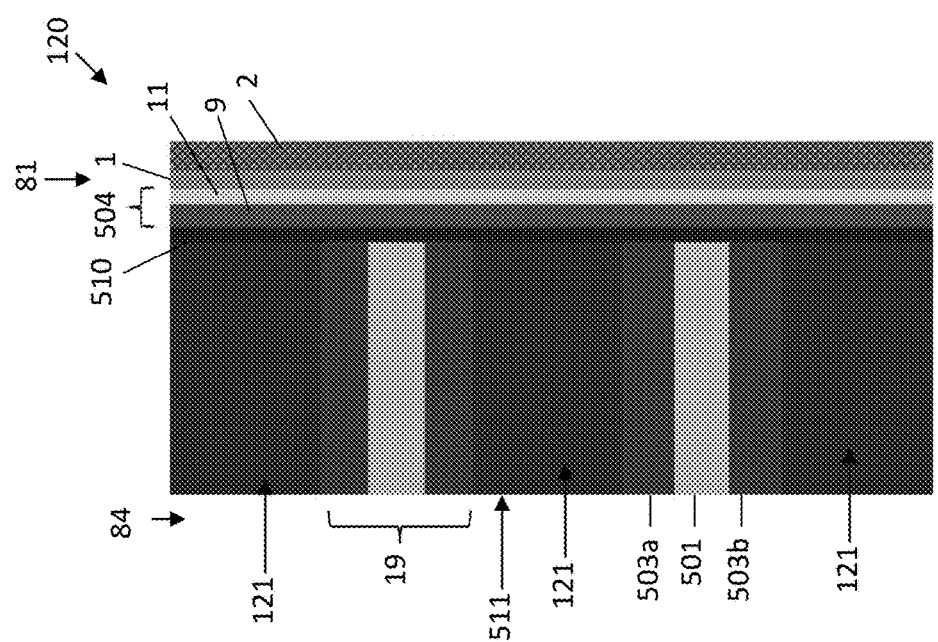

A second embodiment method of making a NAND string 150 with air gaps between the respective device levels is illustrated in FIGS. 6A-6D. FIGS. 6A-6D are partial cross-section views showing the region 520 of the stack 120 indicated by dashed lines in FIG. 5D. FIG. 6A corresponds to FIG. 5D, and illustrates the stack 120 after formation of the cover layer 510, the at least one memory film 504, the semiconductor channel 1 and the insulating fill material 2 within the front side memory opening 81, and the etching of the stack 120 to form the backside opening 84. FIG. 6B corresponds to FIG. 5G, and illustrates the stack 120 after removing the first material layers 121 and portions of the cover layer 510 through the backside opening 84 to form the backside recesses 509 (see FIGS. 5E-5F) and spaced apart segments 517 of the cover layer 510, forming a blocking dielectric 7 through the backside opening within each of the backside recesses 509, and forming control gate electrodes 3 through the backside opening 84 and over the blocking dielectric 7 within each of the backside recesses 509.

Figure 6D:
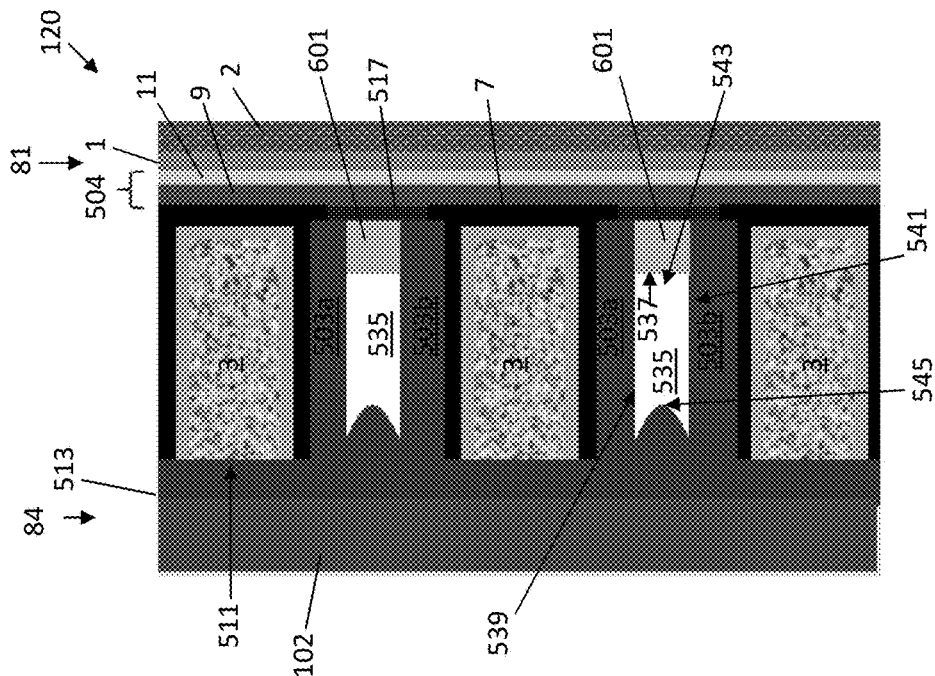
Figure 6C:
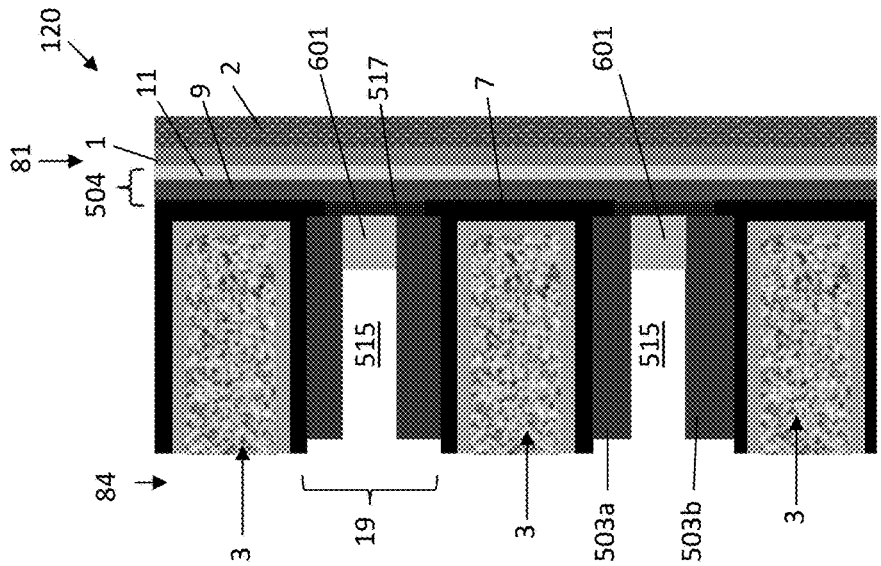

Referring to FIG. 6C, the layers 501 of the first silicon oxide material may be selectively etched relative to the layers 503a, 503b of the second silicon oxide material through the backside opening 84 to form second backside recesses 515 within the second material layers 19 of the stack 120. In this embodiment, only a portion of the first silicon oxide material 501 is removed such that portions 601 of the first silicon oxide material remain within the second backside recesses 515 between the layers 503a, 503b of the second silicon oxide material and adjacent to the segments 517 of the cover layer 510.

Referring to FIG. 6D, a layer of insulating material 513 may be formed over the sidewall 511 of the backside opening 84 to enclose the second backside recesses 515 and form air gaps 535 between the respective layers 503a, 503b of the second silicon oxide material. In this embodiment, each of the air gaps 535 is enclosed on the first side 537 by the portion 601 of the first silicon oxide material which remains in the second backside recess 515. The top 539 and bottom 541 sides of the air gaps 535 may be enclosed by the layers 503a and 503b of the second silicon oxide material, respectively, and the second sides 545 may be enclosed by the layer of insulating material 513, as described above in connection with FIG. 5I. The portions 543 of the air gaps 535 adjacent to the remaining portions 601 of the first silicon oxide material may have a substantially rectangular-shaped cross-section in a plane extending perpendicular to the major surface 100a of the substrate 100.

A source side electrode 102 (i.e., source line) comprising an electrically conductive material may be formed within the backside opening 84, as described above with reference to FIG. 5I.

Further embodiment methods of making a NAND string 150 having a low-k insulating material between the respective device levels. In various embodiments, a low-k insulating material between the device levels may provide reduced capacitance between the control gates/word lines, which may improve program speed and device performance in three-dimensional NAND string memory devices.

Figure 7E:
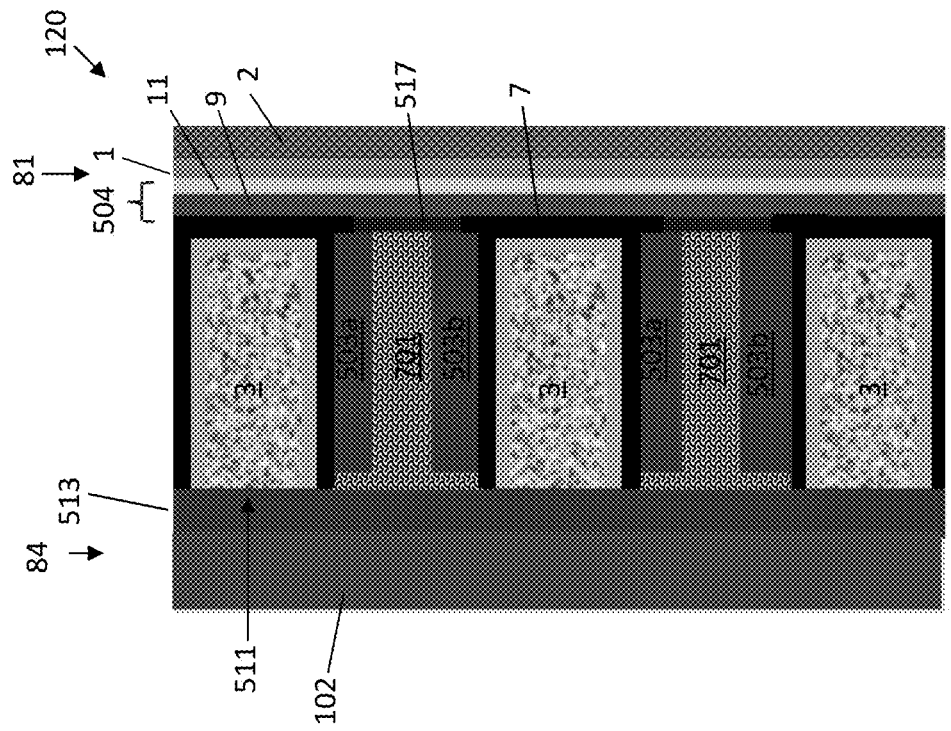

FIGS. 7A-7E illustrate a first embodiment method of making a NAND string having a low-k insulating material located between the respective device levels. FIGS. 7A-7E are partial cross section views showing the region 520 of the stack 120 indicated by dashed lines in FIG. 5D. As in the embodiments of FIGS. 5A-5I and 6A-6D, each of the first material layers 19 of the stack 120 includes a layer 501 of a first silicon oxide material sandwiched between layers 503a, 503b of a second silicon oxide material, where the first silicon oxide material has a higher etch rate than the second silicon oxide material when exposed to the same etching medium. FIG. 7A corresponds to FIG. 5D and illustrates the stack 120 after formation of the cover layer 510, the at least one memory film 504, the semiconductor channel 1 and the insulating fill material 2 within the front side memory opening 81, and the etching of the stack 120 to form the backside opening 84. FIG. 7B corresponds to FIG. 5G, and illustrates the stack 120 after removing the first material layers 121 and portions of the cover layer 510 through the backside opening 84 to form the backside recesses 509 (see FIGS. 5E-5F) and spaced apart segments 517 of the cover layer, forming a blocking dielectric 7 through the backside opening within each of the backside recesses 509, and forming control gate electrodes 3 through the backside opening 84 and over the blocking dielectric 7 within each of the backside recesses 509.

Referring to FIG. 7C, the layers 501 of the first silicon oxide material may be selectively etched relative to the layers 503a, 503b of the second silicon oxide material through the backside opening 84 to form second backside recesses 515 within the second material layers 19 of the stack 120. In this embodiment, the layers 501 of the first silicon oxide material are completely removed to expose the segments 517 of the cover layer 510 in the second backside recesses 515. Alternatively, a portion of the first silicon oxide material may remain in the second backside recesses 515, as described above in connection with FIGS. 6A-6D.

Figure 7D:
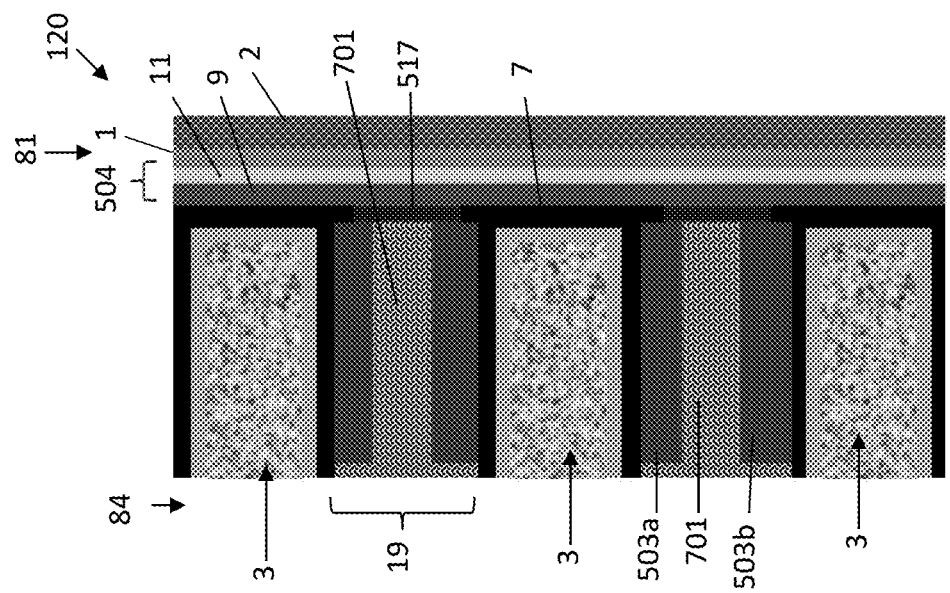

Referring to FIG. 7D, a layer 701 of a third silicon oxide material may be formed in each of the second backside recesses 515 through the backside opening 84, where the third silicon oxide material has a lower dielectric constant than the dielectric constant of the second silicon oxide material. The third silicon oxide material may be different than both the first silicon oxide material and the second silicon oxide material. In embodiments, the third silicon oxide material may be a low-k dielectric, which for the purposes of this disclosure is defined as a material having a dielectric constant (κ) below 3.9 (e.g., 1.5≤κ<3.9, such as 2.0≤κ≤3.8, including 2.5≤κ≤3.6).

In embodiments, the layers 701 of the third silicon oxide material may be doped to provide a dielectric constant that is lower than the dielectric constant of the second silicon oxide material. The third silicon oxide material may be doped with at least one of fluorine and carbon, for example.

In some embodiments, the layers 503a, 503b of the second silicon oxide material may be slightly recessed within the second backside opening 515. As shown in FIG. 7C, for example, recessed portions 703 may be formed in the layers 503a, 503b of second silicon oxide material. These recessed portions 703 may be formed during an etching step, such as an etching step to remove the blocking dielectric 7 from the sidewall 511 of the backside opening 84 and/or the selective etching step to remove the layers 501 of first silicon oxide material. In embodiments, the layer 701 of the third silicon oxide material may fill these recessed portions 703, as shown in FIG. 7D.

An etchback step may be performed to remove any of the third silicon oxide material from the backside opening 84, as shown in FIG. 7D. Referring to FIG. 7E, a layer of insulating material 513 may be formed on the sidewall 511 of the backside opening 84, and a source side electrode 102 (i.e., source line) comprising an electrically conductive material may be formed within the backside opening 84, as described above with reference to FIG. 5I.

FIGS. 8A-8F illustrate another embodiment method of making a NAND string having a low-k insulating material located between the respective device levels. FIGS. 8A-8F are partial cross section views showing the region 520 of the stack 120 indicated by dashed lines in FIG. 5D. The embodiment of FIGS. 8A-8F differs from the embodiments of FIGS. 5A-5I, 6A-6D and 7A-7E in that the stack 120 is formed with alternating first material layers 121 and second material layers 19, where each of the second material layers 19 comprises a permanent layer 801 of a first silicon oxide material which is not removed during subsequent processing. Layer 801 is located between two layers 503a, 503b of a second silicon oxide material, and the first silicon oxide material has a lower dielectric constant than the second silicon oxide material. In embodiments, the first silicon oxide material layer 801 may be a low-k material having a dielectric constant that is less than 3.9, as described above.

In embodiments, the layers 801 of first silicon oxide material may be doped to provide a dielectric constant that is lower than the dielectric constant of the second silicon oxide material. The first silicon oxide material may be doped with at least one of fluorine and carbon, for example. In embodiments, the layers 503a, 503b of second silicon oxide material may comprise silicon oxide formed by plasma enhanced chemical vapor deposition (PECVD) using a tetraethyl orthosilicate (TEOS) source.

Figures 8A, 8B, 8C:
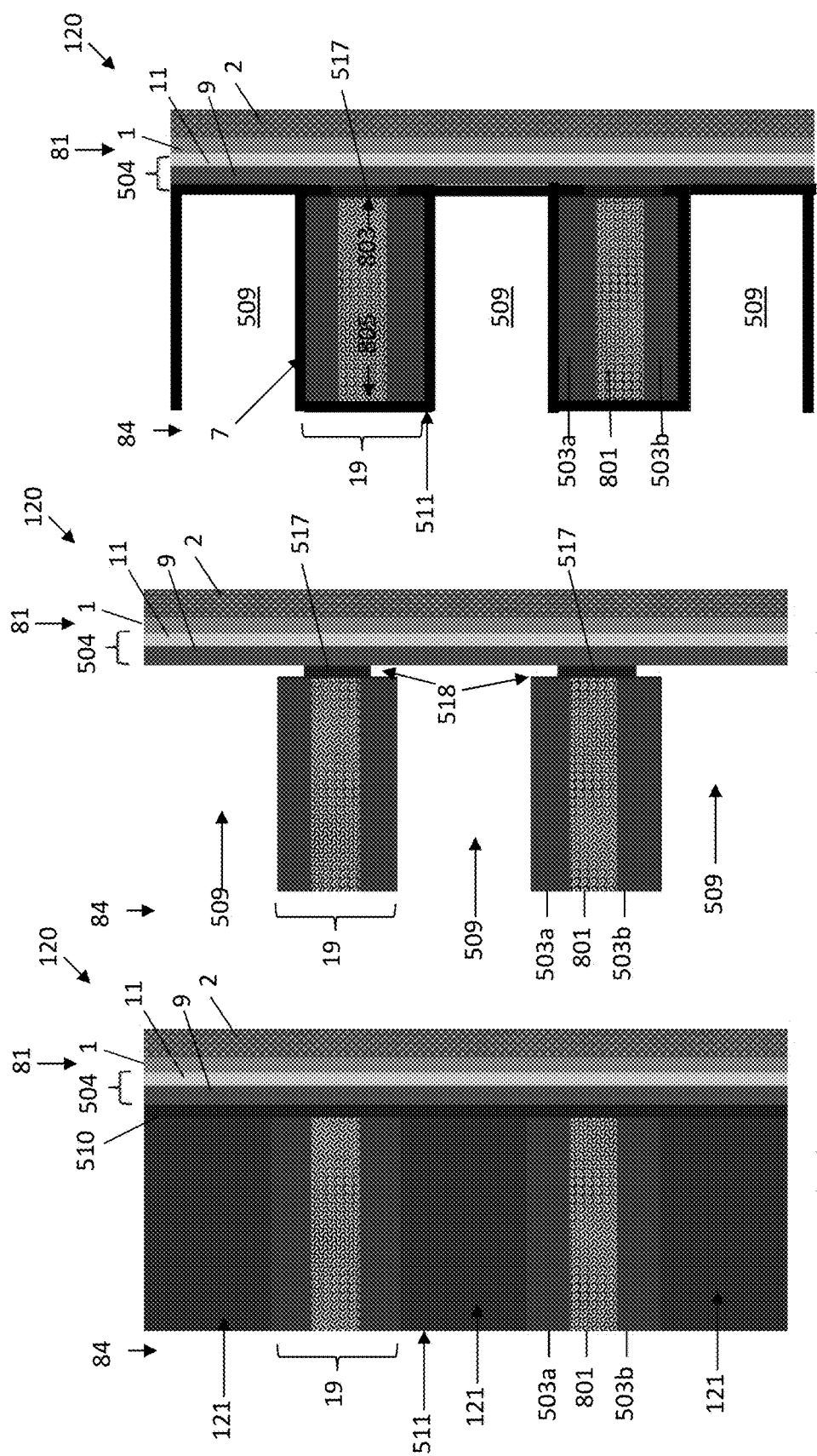

FIG. 8A illustrates the stack 120 after formation of the cover layer 510, the at least one memory film 504, the semiconductor channel 1 and the insulating fill material 2 within the front side memory opening 81, and the etching of the stack 120 to form the backside opening 84, as discussed above.

FIG. 8B corresponds to FIG. 5E described above, and illustrates the first material layers removed through the backside opening 84 to form backside recesses 509 between the second material layers 19. Layers 121 may be removed by selective etching, such as a silicon nitride selective etching (e.g., a hot phosphoric acid wet etch) which removes silicon nitride layers 121 but does not remove the silicon oxide material of layers 19.

Also shown in FIG. 8B are portions of the cover layer 510 adjacent to the first material layers 121 removed by etching to expose the memory film 504 (e.g., the charge storage material 9) in each of the backside recesses 509 and forming vertically spaced-apart segments 517 of the cover layer 510 over the sidewalls 507 of the memory openings 81. The etching may also remove portions of the cover layer 510 that are adjacent to the layers 503a, 503b of the second silicon oxide material to provide void areas 518 between at least a portion of each of the layers 503a, 503b of second silicon oxide material and the memory film 504. The spaced apart segments 517 of the cover layer 510 may be located between the memory film 504 and each of the layers 801 of the first silicon oxide material.

Referring to FIG. 8C, a blocking dielectric 7 may be formed in the backside recesses 509 through the backside opening 84. The blocking dielectric 7 may be formed over the portions of the memory film 504 exposed in the backside recesses 509 and within the void areas 518 between the memory film 504 and layers 503a, 503b. The embodiment of FIG. 8C differs from the embodiments of FIGS. 5A-5I, 6A-6D and 7A-7E in that the blocking dielectric 7 in FIG. 8C extends over the sidewall 511 of the backside opening 84, including over the exposed minor surfaces of layers 503a, 801 and 503b. In this embodiment, at least a portion of the blocking dielectric 7 may remain on the sidewall 511 of the backside opening 84, and each of the second material layers 19 of the stack 120 may have a first side surface 803 facing the semiconductor channel 1 and a second side surface 805 opposite the first side surface 803 and the blocking dielectric 7 extends over the second side surfaces 805 of the layers 19.

The blocking dielectric 7 may comprise a single layer or a stack of at least two layers of different insulating materials. For example, the different insulating materials may include silicon oxide, silicon nitride, silicon oxynitride and/or a high-k material such as $Al_2O_3$, $HfO_2$, HfSiO, $TaO_2$ or other metal oxides. In one embodiment, the blocking dielectric 7 may include a stack comprising at least one layer of silicon oxide and at least one layer of a metal oxide, such as aluminum oxide and/or hafnium oxide.

FIG. 8D corresponds to FIG. 5G described above, and illustrates the formation of control gate electrodes 3 over the blocking dielectric 7 in the backside recesses 509 through the backside opening 84. FIGS. 8E and 8F correspond to FIG. 5I described above, and illustrate the formation of a layer of insulating material 513 on the sidewall 511 of the backside opening 84 (FIG. 8E), and the formation of a source side electrode 102 (i.e., source line) comprising an electrically conductive material within the backside opening 84 (FIG. 8F).

Figure 9B:
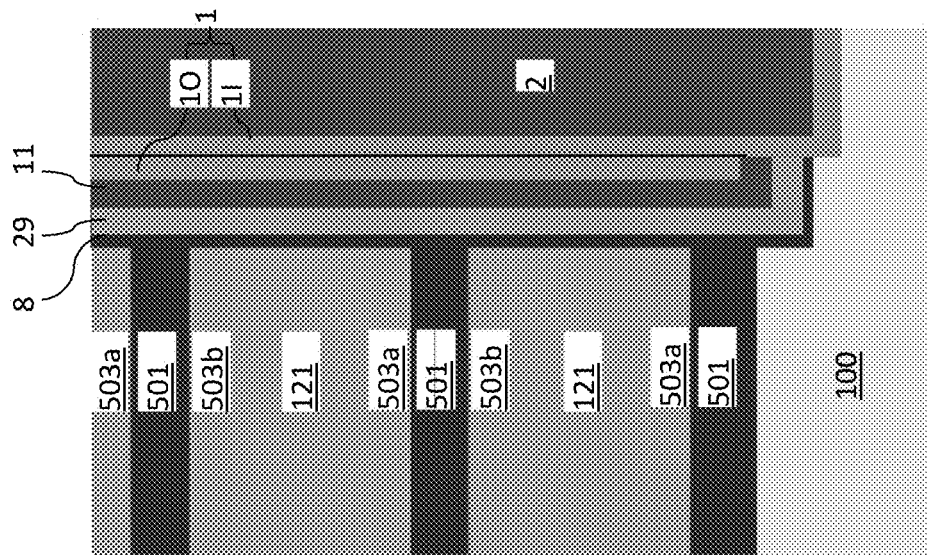
Figure 9A:
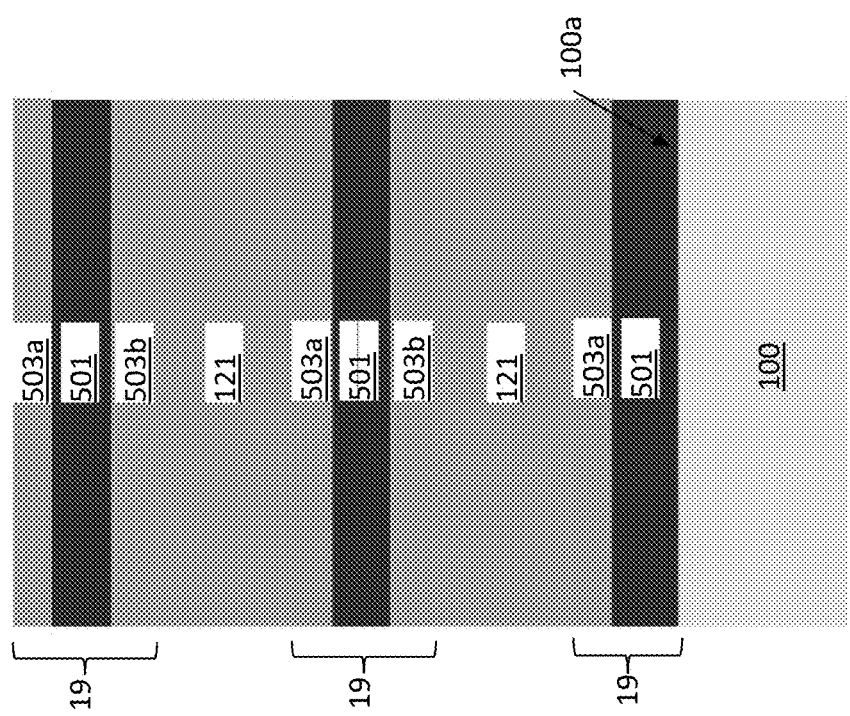

Referring to FIG. 9A, an exemplary structure for forming a NAND string is illustrated, which includes a vertically repeating stack of a unit layer stack (121, 503b, 501, 503a) over a substrate 100. The the unit layer stack (121, 503b, 501, 503a) includes a sacrificial material layer 121 (e.g., first material layer), a lower silicon oxide material layer 503b (second silicon oxide material layer) overlying the sacrificial material layer 121, a first silicon oxide material layer 501 overlying the lower silicon oxide material layer 503b, and an upper silicon oxide material layer 503a (another second silicon oxide material layer) overlying the first silicon oxide material layer 501. The sacrificial material layers 121 can have the same composition and/or thickness as the first material layers 121 as described above. The first silicon oxide material layers 501 can have the same composition and/or thickness as the layers 501 of the first silicon oxide material as described above. The lower and upper silicon oxide material layers (503b, 503a) can have the same composition and/or thickness as the layers (503b, 503b) of the second silicon oxide material as described above. Each vertical stack of a lower silicon oxide material layer 503b, a first silicon oxide material layer 501, and an upper silicon oxide material layer 503a constitutes an electrically insulating layer 19. A unit layer stack (121, 503b, 501, 503a) may contact a top surface of the substrate 100. Alternatively, an incomplete subset of a unit layer stack including at least the topmost layer of the unit layer stack and not including at least the bottommost layer of the unit layer stack may be formed on a top surface of the substrate 100. Alternatively or additionally, a suitable dielectric material layer (not shown), such as a gate dielectric layer, may be formed on the surface of the substrate 100 prior to forming the vertically repeating stack of unit layer stacks.

Referring to FIG. 9B, one or more memory openings can be formed through the vertically repeating stack employing application and lithographic patterning of a photoresist layer, and transfer of the pattern in the photoresist layer through the vertically repeating stack employing at least one anisotropic etch process. A layer stack including a blocking dielectric layer (e.g., the cover layer) 8, a memory material layer (e.g., the charge storage layer) 29, a tunneling dielectric 11, and a semiconductor channel 1 can be formed on the sidewall of each memory opening.

The blocking dielectric layer 8 is a continuous layer that can include any of the materials that can be employed for the blocking dielectrics 7 described above. For example, the blocking dielectric layer 8 can include silicon oxide, a dielectric metal oxide (such as aluminum oxide), or a combination or a layer stack thereof. In one embodiment, the blocking dielectric layer 8 can include silicon oxide. The blocking dielectric layer 8 can be deposited by a conformal deposition method such as chemical vapor deposition or atomic layer deposition. The thickness of the blocking dielectric layer 8 can be in a range from 2 nm to 10 nm, although lesser and greater thicknesses can also be employed.

The memory material layer 29 can include any material that can be employed for the charge storage regions 9 as described above. For example, the memory material layer 29 can include silicon nitride. The memory material layer 29 can be deposited by a conformal deposition method such as chemical vapor deposition or atomic layer deposition. The thickness of the memory material layer 29 can be in a range from 2 nm to 6 nm, although lesser and greater thicknesses can also be employed.

The tunneling dielectric 11 can include any material that can be employed for the tunneling dielectric 11 as described above. For example, the tunneling dielectric layer 11 can include a layer stack of a silicon oxide layer, a silicon nitride layer, and a silicon oxide layer, which is referred to as an ONO stack. The tunneling dielectric 11 can be formed by conformal deposition methods and optionally a thermal or plasma conversion method (such as thermal nitridation and/or thermal oxidation). The thickness of the tunneling dielectric 11 can be in a range from 1.5 nm to 4 nm, although lesser and greater thicknesses can also be employed.

The semiconductor channel 1 can be formed, for example, by forming an outer semiconductor channel layer 1O, physically exposing a semiconductor surface of the substrate 100 underneath each memory opening, and forming an inner semiconductor channel layer 11. Specifically, the outer semiconductor channel layer 1O including a first semiconductor material (such as polysilicon or amorphous silicon) can be formed on the tunneling dielectric 11. Horizontal portions of the tunneling dielectric 11, the memory material layer 29, and the blocking dielectric layer 8 can be anisotropically etched employing at least one anisotropic etch process to physically expose a semiconductor surface of the substrate 100 underneath each memory opening. The inner semiconductor channel layer 11 including a second semiconductor material (such as polysilicon or amorphous silicon) can be deposited to form the semiconductor channel 1. An anneal may be performed to convert any amorphous semiconductor material in the semiconductor channel 1 into a polycrystalline semiconductor material. An insulating fill material may be deposited to fill any cavity inside the semiconductor channel, thereby forming a dielectric core 2 in each memory opening.

Figure 9D:
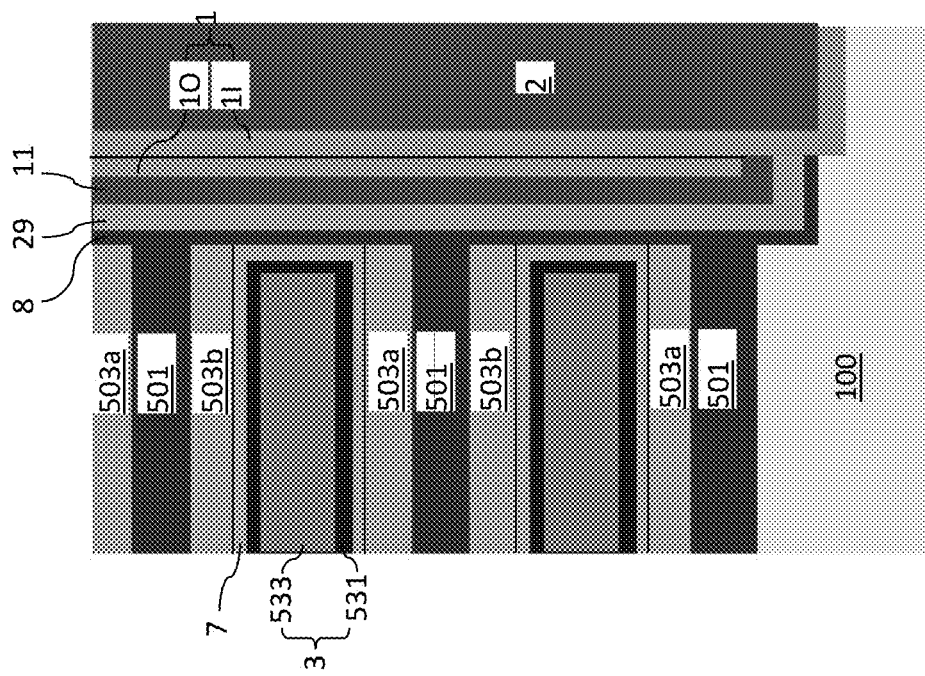
Figure 9C:
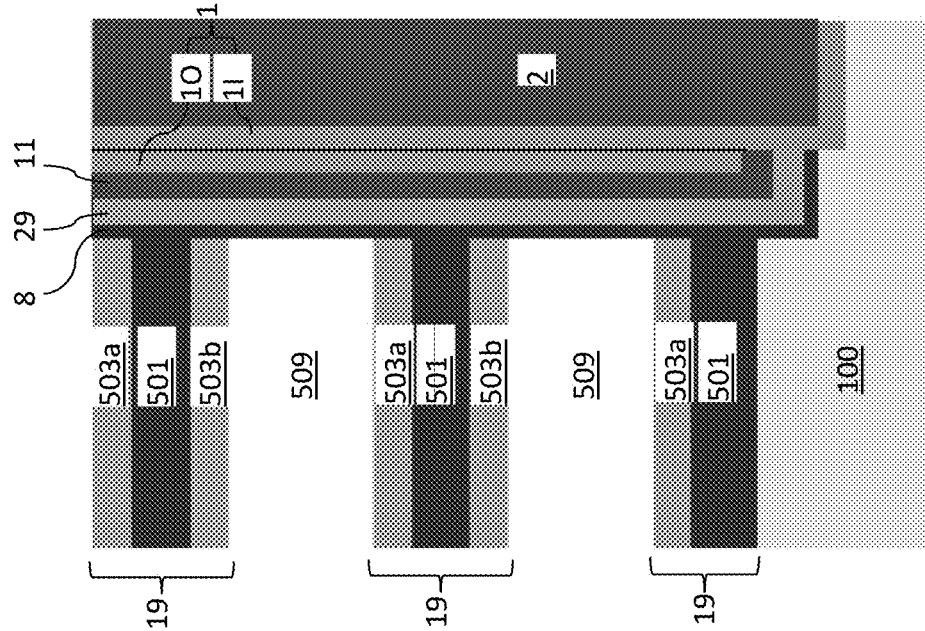

Referring to FIG. 9C, backside openings (such as illustrated in FIGS. 5D-5H) can be formed through the vertically repeating stack. The sacrificial material layers 121 may be removed through the backside opening to form first backside recesses 509 between the second material layers 19. In an illustrative example, the sacrificial material layers 121 can include silicon nitride, and the electrically insulating layers 19 can include stacks of silicon oxide material layers. In this case, the sacrificial material layers 121 may be removed by selective etching, such as a silicon nitride selective etching (e.g., a hot phosphoric acid wet etch) which removes silicon nitride of the sacrificial material layers 121 but does not remove the silicon oxide material of the electrically insulating layers 19. A first backside recess 509 is formed within each volume from which a sacrificial material layer 121 is removed. A first backside recess 509 can be vertically bounded by an underlying upper silicon oxide material layer 503a and an overlying lower silicon oxide material layer 503b and by an outer surface of the blocking dielectric layer 8.

Referring to FIG. 9D, a blocking dielectric, which is herein referred to as a backside blocking dielectric 7 to distinguish from the blocking dielectric layer 8, may be optionally formed in the first backside recesses 509 through the backside opening. The backside blocking dielectrics 7 can have the same composition and/or thickness as the blocking dielectrics 7 described above. In one embodiment, the backside blocking dielectrics 7 can include at least one dielectric metal oxide material such as aluminum oxide. The backside blocking dielectrics 7 may be formed over the physically exposed surfaces of the blocking dielectric layer 8. The backside blocking dielectric 7 may comprise a single layer or a stack of at least two layers of different insulating materials. For example, the different insulating materials may include silicon oxide, silicon nitride, silicon oxynitride and/or a high-k material such as $Al_2O_3$, $HfO_2$, HfSiO, $TaO_2$ or other metal oxides. In one embodiment, the backside blocking dielectrics 7 may include a stack comprising at least one layer of silicon oxide and at least one layer of a metal oxide, such as aluminum oxide and/or hafnium oxide.

Control gate electrodes, as embodied as electrically conductive layers 3, may be formed over the backside blocking dielectrics 7 in the remaining volumes of the first backside recesses 509 through the backside opening. Each electrically conductive layer 3 can be formed within a remaining volume of a respective first backside recess 509 and directly on a respective backside blocking dielectric 7. Each of the electrically conductive layers 3 can be embedded within a respective backside blocking dielectric 7. Each of the electrically conductive layers 3 may comprise one or more electrically conductive materials, such as a metal, metal nitride, metal silicide or heavily doped semiconductor material. In one embodiment, the electrically conductive layers 3 are formed by depositing a metal nitride liner material 531 (e.g., tungsten nitride (WN) or titanium nitride (TiN) liner) over the backside blocking dielectrics 7 in the first backside recesses 509, followed by depositing a metal material 533 (e.g., tungsten) over the metal nitride liner material 531 to fill the first backside recesses 509. Any of the metal material 533 and/or metal nitride liner material 531 located in the backside opening may be removed from the backside opening 84 (e.g., via one or more etching steps) so that each electrically conductive layer 3 is electrically isolated from overlying and underlying electrically conductive layers 3. Thus, each sacrificial material layers 121 can be replaced with electrically conductive layers 3 and optional backside blocking dielectrics 7.

Figure 9F:
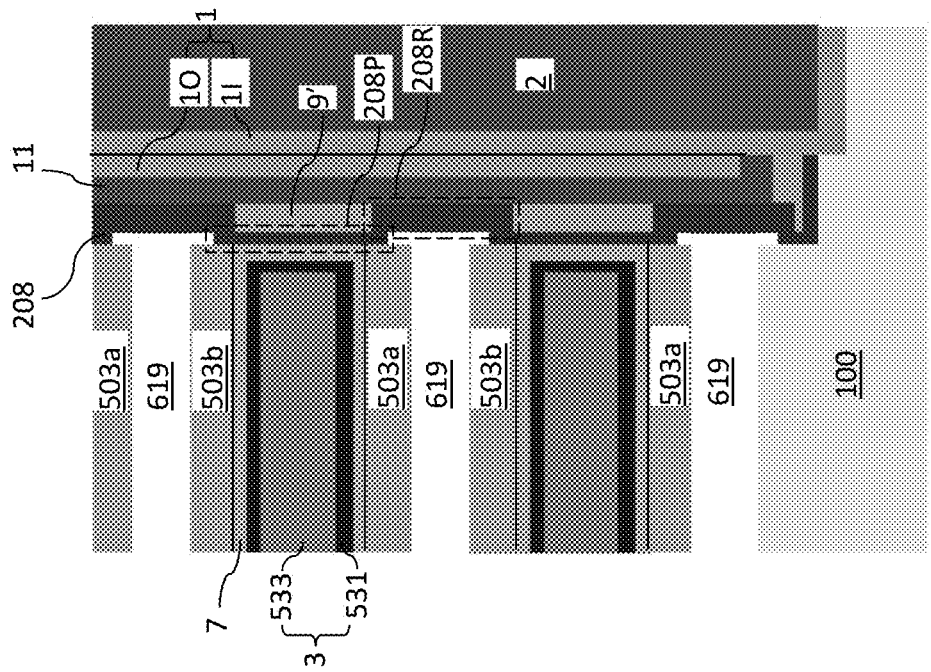
Figure 9E:
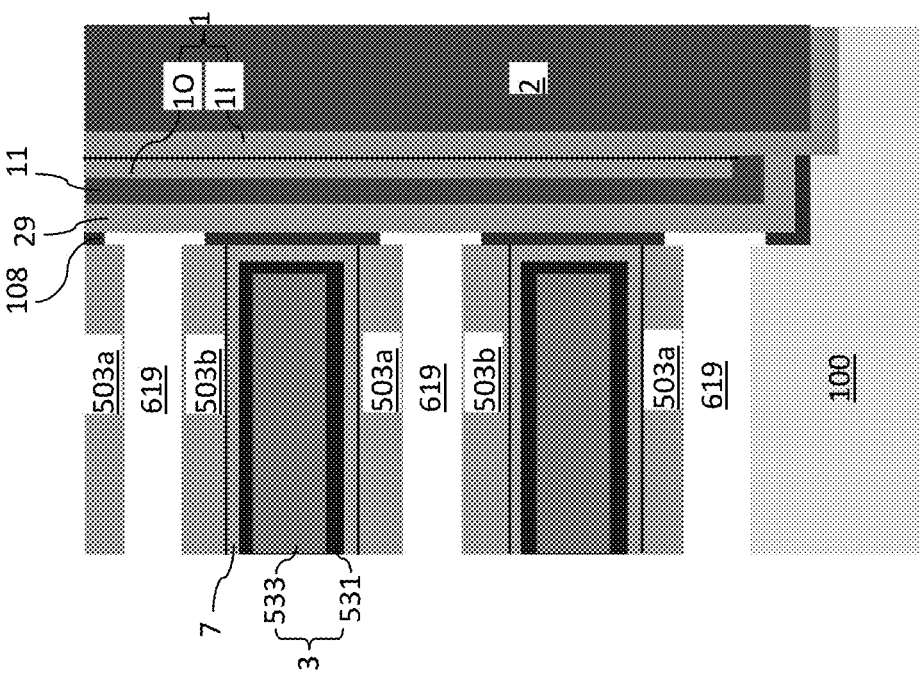

Referring to FIG. 9E, the first silicon oxide material layers 501 can be removed selective to materials of the lower silicon oxide material layers 503b and the upper silicon oxide material layers 503a to form second backside recesses 619. The etch process that removes the material of the first silicon oxide material layers 501 selective to the materials of the upper and lower silicon oxide material layers (503a, 503b) can be the same as the etch process that removes the material of the layer 501 of the first silicon oxide material selective to the layers (503a, 503b) of the second silicon oxide material as described above.

In addition, portions of the blocking dielectric layer 8 that are proximal to the second backside recesses 619 can be removed at each level of the first oxide material layers 501, i.e., at each level of the second backside recesses 619. The remaining portions of the blocking dielectric layer 8 constitutes discrete blocking dielectrics 108 that are vertically spaced apart and located at each level of the second backside recesses 619. The etch process that removes the physically exposed portions of the blocking dielectric layer 8 can be selective to the material of the memory material layer 29. For example, the blocking dielectric layer 8 can include silicon oxide, the memory material layer 29 can include silicon nitride, and the etch process that removes the physically exposed portions of the blocking dielectric layer 8 can employ dilute hydrofluoric acid that etches silicon oxide selective to silicon nitride. In one embodiment, the discrete blocking dielectrics 108 can be vertically recessed with respect to the top surfaces of the lower silicon oxide material layer 503b and with respect to the bottom surfaces of the upper silicon oxide material layer 503a. In this case, portions of sidewall surfaces of the lower and upper silicon oxide material layers (503a, 503b) can be physically exposed to the expanded second backside recesses 619.

Referring to FIG. 9F, physically exposed portions of the memory material layer 29 can be oxidized after formation of the discrete blocking dielectrics 108. The oxidation process can include a thermal oxidation process and/or a plasma oxidation process. Physically exposed portions of the memory material layer 29 can be converted into respective dielectric oxide portions, and can be adjoined to the discrete blocking dielectrics 108 to form a continuous blocking dielectric layer 208. The continuous blocking dielectric layer 208 can include all materials of the discrete blocking dielectrics 108 and the dielectric oxide portions formed by oxidation of the physically exposed portions of the memory material layer 29. The continuous blocking dielectric layer 208 can continuously extend vertically through the memory opening, i.e., from the bottom surface of the memory opening that contacts the substrate 100 to the topmost portion of the memory opening.

In one embodiment, the continuous blocking dielectric layer 208 may have a vertical compositional modulation (i.e., a composition modulation that occurs along a vertical direction) due to compositional differences in the discrete blocking dielectric portions 108 and the material of the memory material layer 29 as originally provided. In case the memory material layer 29 as provided includes silicon nitride, the continuous blocking dielectric layer 208 may have a vertical composition modulation in a concentration of nitrogen atoms such that the concentration of nitrogen atoms is at maxima at levels of the second backside recesses 619 and is at minima at levels of the electrically conductive layers 3. In other words, the continuous blocking dielectric layer 208 may comprise silicon oxide adjacent to the control gate electrodes 3 and silicon oxynitride adjacent to the recesses 619 which will be filled with insulating layers (referred to as dielectric fill material 611 having horizontal portions 611H), as will be described below. The inner sidewall and the outer sidewall of the continuous blocking dielectric layer 208 can undulate along the vertical direction, i.e., along the direction along which the memory opening extends (i.e., perpendicular to the major/top surface 100a of the substrate 100). In one embodiment, the continuous blocking dielectric layer 208 can include a plurality of laterally protruding portions 208P in contact with an outer sidewall of a respective remaining portion of the memory material layer 29, and a plurality of laterally recessed portions 208R extending between a respective pair of laterally protruding portions 208P and contacting a respective portion of an outer sidewall of the tunneling dielectric 11. The portion 208P protrudes in a horizontal direction (i.e., parallel to the top/major surface 100a of the substrate 100) away from the channel. Portion 208R is recessed in the horizontal direction toward the channel 1.

In one embodiment, each surface of the charge storage regions 9' can be in physical contact with the continuous blocking dielectric layer 208 and/or the tunneling dielectric 11. In one embodiment, the plurality of laterally recessed regions 208R can comprise a silicon oxynitride in which an atomic concentration of nitrogen atoms is grater than 0.1%, and the plurality of laterally protruding regions 208P can comprise a silicon oxide material in which an atomic concentration of nitrogen atoms is less than 100 parts per million (e.g., less than $10^{19}$ cm$^{-3}$).

Unoxidized portions of the memory material layer 29 form discrete charge storage regions 9' that are located at each level of the electrically conductive layers 3. The discrete charge storage regions 9' laterally surround the semiconductor channel 1. The discrete charge storage regions 9' can be vertically spaced apart from one another. Each discrete charge storage region 9' can have an annular shape, i.e., a shape that can be continuously stretched to a torus without forming or destroying a hole therein.

Referring to FIG. 9G, a dielectric material can be deposited in the second backside recesses 619 to form the dielectric fill material regions. In one embodiment, the dielectric fill material regions can be formed by deposition of a contiguous dielectric fill material layer 611 directly on sidewalls of each conductive material layer 3, each lower silicon oxide layer 503*b*, and each upper silicon oxide layer 503*a* within the vertically repeating stack of a unit layer stack. The unit layer stack includes a conductive material layer 3, a lower silicon oxide material layer 503*b* overlying the conductive material layer 3, a dielectric fill material region (a horizontal region of the continuous dielectric fill material layer 611) overlying the lower silicon oxide material layer 503*b*, and an upper silicon oxide material layer 503*a* overlying the dielectric fill material region. The bottommost unit layer stack may be spaced from the top surface of the substrate 100 by less than a full set of layers of the unit layer stack (such as a dielectric fill material region and an upper silicon oxide material layer 503*a* as illustrated in FIG. 9G).

The continuous dielectric fill material layer 611 may have the same composition as the layer of insulating material 513 or a layer of a third silicon oxide material 701 as described above. Further, the same deposition method can be employed to form the continuous dielectric fill material layer 611 as the deposition methods employed to form the layer of insulating material 513 or a layer of a third silicon oxide material 701 as described above. In one embodiment, the deposited dielectric material of the continuous dielectric fill material layer 611 can each of the second backside recesses 619 without a cavity therein. In an illustrative example, a conformal deposition method such as low pressure chemical vapor deposition (LPCVD) can be employed to deposit the continuous dielectric fill material layer 611 such that the second backside recesses 619 are completely filled with the deposited dielectric material, and do not include any cavity that is free of a solid material. In one embodiment, each of the dielectric fill material regions can include a first vertically protruding portion PR1 that contacts a sidewall of a respective upper silicon oxide material layer 503*a*, and a second vertically protruding portion PR2 that contacts a sidewall of a respective lower silicon oxide material layer 503*b*. The dielectric fill material layer may comprise silicon oxide having a dielectric constant of about 3.9 or a low-k dielectric material having a dielectric constant below 3.9, as described above.

Referring to FIG. 9H, a non-conformal deposition method may be employed to deposit the continuous dielectric fill material layer 611 instead of a conformal deposition method. An exemplary non-conformal deposition method is plasma enhanced chemical vapor deposition (PECVD). In this case, the non-conformally deposited dielectric material can form a cavity 635 within each second backside recess 619. Each cavity 635 within each level of the backside recesses 619 can be free of any solid material. The cavities 635 may be filled with a residual process gas during deposition, air, or nitrogen, and/or may be partially or fully under vacuum.

The exemplary structures of FIGS. 9G and 9H can include a monolithic three-dimensional memory device. A semiconductor channel 1 extends through the vertically repeating stack of a unit layer stack (3, 7, 503*b*, 611H, 503*a*). The unit layer stack (3, 7, 503*b*, 611H, 503*a*) includes a conductive material layer 3, a lower silicon oxide material layer 503*b* overlying the conductive material layer 3, a dielectric fill material region 611H (a horizontal region of the continuous dielectric fill material layer 611) overlying the lower silicon oxide material layer 503*b*, and an upper silicon oxide material layer 503*a* overlying the dielectric fill material region. At least one end portion of the semiconductor channel 1 extends substantially perpendicular to a top surface of a substrate 100. Discreet charge storage regions 9' (as embodied as remaining portions of the memory material layer 29) are located at each level of the electrically conductive layers 3, laterally surround the semiconductor channel 1, and are physically vertically spaced from one another by the recessed portions 208P of the blocking dielectric layer 208. The unit layer stack (3, 7, 503*b*, 611H, 503*a*) can include a backside blocking dielectric 7 comprising a dielectric metal oxide and contacting a top surface, a bottom surface, and a sidewall surface of a respective electrically conductive layer 3.

A tunneling dielectric 11 laterally surrounds the semiconductor channel 1. An inner sidewall of each charge storage region 9' contacts a respective portion of an outer sidewall of the tunneling dielectric 11. A continuous blocking dielectric layer 208 contacts each lower silicon oxide material layer 503*b*, each upper silicon oxide material layer 503*a*, and each dielectric fill material region 611H, each charge storage region 9', and the tunneling dielectric 11. The continuous blocking dielectric layer 208 can comprise a plurality of laterally protruding portions 208P in contact with an outer sidewall of a respective charge storage region 9', and a plurality of laterally recessed portions 208R extending between a respective pair of laterally protruding portions 208P and contacting a respective portion of the outer sidewall of the tunneling dielectric 11.

In one embodiment, the dielectric fill material region 611H consists of a dielectric material portion having a homogenous composition and does not include any cavity as illustrated in FIG. 9G. In another embodiment, the dielectric fill material region comprises a cavity that is free of a solid material and is encapsulated by the dielectric material of the horizontal portion of the continuous dielectric fill material layer 611 as illustrated in FIG. 9H.

In one embodiment, each charge storage region 9' can have an annular shape, a vertical inner sidewall, and a vertical outer sidewall. In one embodiment, the charge storage regions 9' can comprise silicon nitride, and the semiconductor channel 1 can comprise a polycrystalline silicon-containing semiconductor material, such as polysilicon.

In one embodiment, the dielectric fill material regions 611H can be portions of a contiguous dielectric fill material layer 611 that contacts sidewalls of each conductive material layer 3, each lower silicon oxide layer 503*b*, and each upper silicon oxide layer 503*a* within the vertically repeating stack.

Figure 10B:
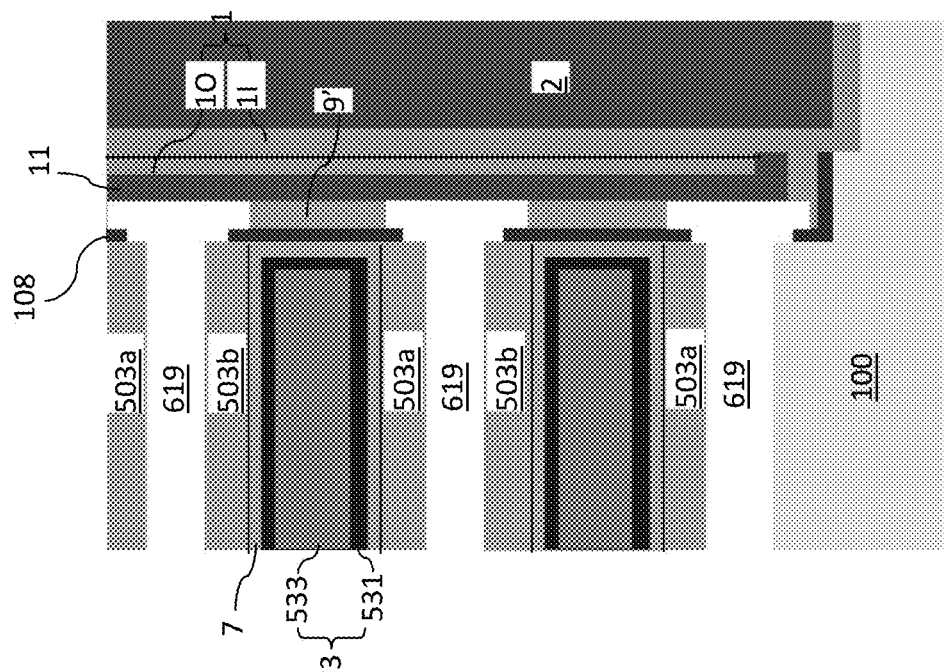
Figure 10A:
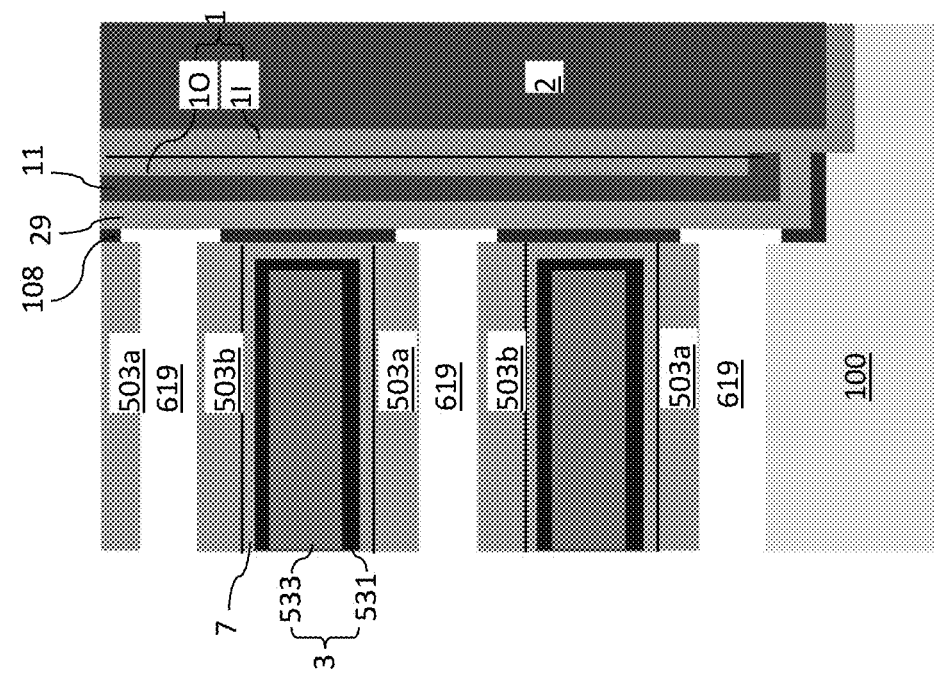

Referring to FIG. 10A, another exemplary structure according to another embodiment of the present disclosure is illustrated, which can be the same as the exemplary structure illustrated in FIG. 9E. In this embodiment, the memory material layer 29 is etched rather than selectively oxidized to form discreet charge storage regions 9'.

Referring to FIG. 10B, physically exposed portions of the memory material layer 29 can be removed at each level of the second backside recesses 619, which are the levels of the first oxide material layers 501. An etch process that removes the material of the memory material layer 29 selective to the material of the tunneling dielectric 11 can be employed. For example, if the memory material layer 29 includes silicon nitride and the tunneling dielectric 11 includes an ONO stack, hot phosphoric acid can be employed to remove physically exposed portions of the memory material layer 29 selective to the tunneling dielectric 11. Remaining portions of the memory material layer 29 form discrete charge storage regions 9', which are physically vertically spaced apart by the recesses 619 and are located at each level of the electrically conductive layers 3. Portions of an outer sidewall of the tunneling dielectric 11 can be physically exposed at each level from which the first oxide material layers 501 are physically removed, i.e., at each level of the second backside recesses 619.

In one embodiment, removal of the physically exposed portions of the memory material layer 29 can be performed selective to the discrete blocking dielectrics 108. For example, if the discrete blocking dielectrics 108 includes silicon oxide and/or aluminum oxide, the tunneling dielectric 11 includes an ONO stack, and the memory material layer 29 includes silicon nitride, a wet etch employing hot phosphoric acid can remove physically exposed portions of the memory material layer 29 selective to the tunneling dielectric 11 and the discrete blocking dielectrics 108. In this case, an upper portion and a lower portion of an inner sidewall of each discrete blocking dielectric 108 can be physically exposed, a middle portion of the inner sidewall of each discrete blocking dielectric 108 can contact an outer sidewall of a respective charge storage region 9'.

Referring to FIG. 10C, a dielectric material can be deposited in the second backside recesses 619 to form the dielectric fill material regions. In one embodiment, the dielectric fill material regions can be formed by deposition of a contiguous dielectric fill material layer 611 directly on sidewalls of each conductive material layer 3, each lower silicon oxide layer 503b, and each upper silicon oxide layer 503a within the vertically repeating stack of a unit layer stack. The unit layer stack includes a conductive material layer 3, a lower silicon oxide material layer 503b overlying the conductive material layer 3, a dielectric fill material region (a horizontal region of the continuous dielectric fill material layer 611) overlying the lower silicon oxide material layer 503b, and an upper silicon oxide material layer 503a overlying the dielectric fill material region. The bottommost unit layer stack may be spaced from the top surface of the substrate 100 by less than a full set of layers of the unit layer stack (such as a dielectric fill material region and an upper silicon oxide material layer 503a as illustrated in FIG. 10C).

The continuous dielectric fill material layer 611 may have the same composition as the layer of insulating material 513 or a layer of a third silicon oxide material 701 as described above (e.g., silicon oxide or a low-k dielectric). Further, the same deposition method can be employed to form the continuous dielectric fill material layer 611 as the deposition methods employed to form the layer of insulating material 513 or a layer of a third silicon oxide material 701 as described above. In one embodiment, the deposited dielectric material of the continuous dielectric fill material layer 611 can entirely fill each of the second backside recesses 619 without a cavity therein. In an illustrative example, a conformal deposition method such as low pressure chemical vapor deposition (LPCVD) can be employed to deposit the continuous dielectric fill material layer 611 such that the second backside recesses 619 are completely filled with the deposited dielectric material, and do not include any cavity that is free of a solid material. In one embodiment, each of the dielectric fill material regions can include a first vertically protruding portion PR1 that contacts a sidewall of a respective upper silicon oxide material layer 503a, and a second vertically protruding portion PR2 that contacts a sidewall of a respective lower silicon oxide material layer 503b.

Referring to FIG. 10D, a non-conformal deposition method may be employed to deposit the continuous dielectric fill material layer 611 instead of a conformal deposition method. An exemplary non-conformal deposition method is plasma enhanced chemical vapor deposition (PECVD). In this case, the non-conformally deposited dielectric material can form a cavity 635 within each second backside recess 619. Each cavity 635 within each level of the backside recesses 619 can be free of any solid material. The cavities 635 may be filled with a residual process gas during deposition, air, or nitrogen, and/or may be partially or fully under vacuum.

The exemplary structures of FIGS. 10C and 10D can include a monolithic three-dimensional memory device. A semiconductor channel 1 extends through the vertically repeating stack of a unit layer stack (3, 7, 503b, 611H, 503a). The unit layer stack (3, 7, 503b, 611H, 503a) includes a conductive material layer 3, a lower silicon oxide material layer 503b overlying the conductive material layer 3, a dielectric fill material region 611H (a horizontal region of the continuous dielectric fill material layer 611) overlying the lower silicon oxide material layer 503b, and an upper silicon oxide material layer 503a overlying the dielectric fill material region. At least one end portion of the semiconductor channel 1 extends substantially perpendicular to a top surface of a substrate 100. Charge storage regions 9' (as embodied as remaining portions of the memory material layer 29) are located at each level of the electrically conductive layers 3, laterally surround the semiconductor channel 1, and are vertically spaced from one another. The unit layer stack (3, 7, 503b, 611H, 503a) can include a backside blocking dielectric 7 comprising a dielectric metal oxide and contacting a top surface, a bottom surface, and a sidewall surface of a respective electrically conductive layer 3.

A tunneling dielectric 11 laterally surrounds the semiconductor channel 1. An inner sidewall of each charge storage region 9' contacts a respective portion of an outer sidewall of the tunneling dielectric 11. A plurality of vertically spaced apart blocking dielectrics 108 can contact an outer sidewall of a respective charge storage region 9', and can contact an overlying dielectric fill material region 611H and an underlying dielectric fill material region 611H. Each dielectric fill material region 611H can comprise a dielectric material that contacts a respective portion of the outer sidewall of the tunneling dielectric 11 between a vertically neighboring pair of the charge storage regions 9'. The material of the dielectric fill material region 611H and of the blocking dielectrics 108 may be the same or different from each other. For example, the materials may comprise silicon oxide having different properties from each other.

In case the discrete blocking dielectrics 108 include silicon oxide, an outer sidewall of each charge storage region 9' can contact an inner sidewall of an annular silicon oxide spacer (as embodied by a discrete blocking dielectric 108). In one embodiment, each surface of the charge storage regions 9' can contact a surface the tunneling dielectric 11, a surface the dielectric material of one of the dielectric fill material regions 611H, or a surface of one of the annular silicon oxide spacers 108.

In one embodiment, the dielectric fill material region 611H consists of a dielectric material portion having a homogenous composition and does not include any cavity as illustrated in FIG. 10C. In another embodiment, the dielectric fill material region comprises a cavity that is free of a solid material and is encapsulated by the dielectric material of the horizontal portion of the continuous dielectric fill material layer 611 as illustrated in FIG. 10D.

In one embodiment, each charge storage region 9' can have an annular shape, a vertical inner sidewall, and a vertical outer sidewall. In one embodiment, the charge storage regions 9' can comprise silicon nitride, and the semiconductor channel 1 can comprise a polycrystalline silicon-containing semiconductor material, such as polysilicon.

In one embodiment, the dielectric fill material regions 611H can be portions of a contiguous dielectric fill material layer 611 that contacts sidewalls of each conductive material layer 3, each lower silicon oxide layer 503b, and each upper silicon oxide layer 503a within the vertically repeating stack.

Each of the exemplary structures described above can include a monolithic three-dimensional memory device. The monolithic three-dimensional memory device can comprise a vertical NAND device located in a device region. The electrically conductive layers 3 can comprise, or can be electrically connected to, a respective word line of the NAND device. The device region can comprise a plurality of semiconductor channels 1, a plurality of charge storage regions (9 or 9'), and a plurality of control gate electrodes (as embodied as portions of the electrically conductive layers 3 that are proximal to the semiconductor channels 1). At least one end portion of each of the plurality of semiconductor channels 1 extends substantially perpendicular to a top surface of the substrate 100. Each charge storage region (9 or 9') can be located adjacent to a respective one of the plurality of semiconductor channels 1. The plurality of control gate electrodes can have a strip shape extending substantially parallel to the top surface of the substrate 100. The plurality of control gate electrodes can comprise at least a first control gate electrode located in a first device level and a second control gate electrode located in a second device level. The electrically conductive layers 3 in the vertically repeating stack can comprise or be in electrical contact with the plurality of control gate electrodes and can extend from the device region to a contact region including a plurality of electrically conductive via connections. The substrate 100 can comprise a silicon substrate containing a driver circuit for the vertical NAND device.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. All of the publications, patent applications and patents cited herein are incorporated herein by reference in their entirety.

What is claimed is:

1. A monolithic three-dimensional memory device, comprising:
   a vertically repeating stack of unit layer stacks, each unit layer stack comprising an electrically conductive layer, a lower silicon oxide material layer overlying the electrically conductive layer, a dielectric fill material region overlying the lower silicon oxide material layer, and an upper silicon oxide material layer overlying the dielectric fill material region;
   a semiconductor channel extending through the vertically repeating stack, at least one end portion of the semiconductor channel extending substantially perpendicular to a top surface of a substrate;
   charge storage regions that are located at each level of the electrically conductive layers, laterally surrounding the semiconductor channel, and vertically spaced from one another;
   a tunneling dielectric laterally surrounding the semiconductor channel, wherein an inner sidewall of each charge storage region contacts a respective portion of an outer sidewall of the tunneling dielectric; and
   a continuous blocking dielectric layer that contacts each lower silicon oxide material layer, each upper silicon oxide material layer, and each dielectric fill material region, each charge storage region, and the tunneling dielectric,
   wherein:
   the continuous blocking dielectric layer comprises:
      a plurality of laterally protruding portions in contact with an outer sidewall of a respective charge storage region, and
      a plurality of laterally recessed portions extending between a respective pair of laterally protruding portions and contacting a respective portion of the outer sidewall of the tunneling dielectric;
   the plurality of laterally recessed portions comprises a silicon oxynitride in which an atomic concentration of nitrogen atoms is greater than 0.1%; and
   the plurality of laterally protruding portions comprises a silicon oxide material in which an atomic concentration of nitrogen atoms is less than 100 parts per million.

2. The monolithic three-dimensional memory device of claim 1, wherein each surface of the charge storage regions is in physical contact with the continuous blocking dielectric layer or the tunneling dielectric.

3. The monolithic three-dimensional memory device of claim 1, wherein the dielectric fill material region consists of a dielectric material portion having a homogenous composition and does not include any cavity.

4. The monolithic three-dimensional memory device of claim 1, wherein the dielectric fill material region comprises a cavity that is free of a solid material and is encapsulated by a dielectric material.

5. The monolithic three-dimensional memory device of claim 1, wherein each charge storage region has an annular shape, a vertical inner sidewall, and a vertical outer sidewall.

6. The monolithic three-dimensional memory device of claim 1, wherein:
   the charge storage regions comprise silicon nitride; and
   the semiconductor channel comprises a polycrystalline silicon-containing semiconductor material.

7. The monolithic three-dimensional memory device of claim 1, wherein the dielectric fill material regions are portions of a contiguous dielectric fill material layer that contacts sidewalls of each electrically conductive layer, each lower silicon oxide layer, and each upper silicon oxide layer within the vertically repeating stack.

8. The monolithic three-dimensional memory device of claim 1, wherein each of the dielectric fill material regions comprises:
   a first vertically protruding portion that contacts a sidewall of a respective upper silicon oxide material layer; and
   a second vertically protruding portion that contacts a sidewall of a respective lower silicon oxide material layer.

9. The monolithic three-dimensional memory device of claim 1, wherein the unit layer stack further comprises a backside blocking dielectric comprising a dielectric metal oxide and contacting a top surface, a bottom surface, and a sidewall surface of a respective electrically conductive layer.

10. The monolithic three-dimensional memory device of claim 1, wherein:
   the monolithic three-dimensional memory device comprises a vertical NAND device located in a device region;
   the device region comprises:
      a plurality of semiconductor channels, wherein at least one end portion of each of the plurality of semiconductor channels extends substantially perpendicular to a top surface of the substrate; and
      a plurality of charge storage regions, each charge storage region located adjacent to a respective one of the plurality of semiconductor channels; and
   the plurality of control gate electrodes comprise at least a first control gate electrode located in a first device level and a second control gate electrode located in a second device level.

* * * * *